(12) United States Patent
Chuang et al.

(10) Patent No.: US 11,569,443 B2
(45) Date of Patent: Jan. 31, 2023

(54) SEMICONDUCTOR DEVICE AND METHOD FOR FABRICATING THE SAME

(71) Applicant: TAIWAN SEMICONDUCTOR MANUFACTURING CO., LTD., Hsinchu (TW)

(72) Inventors: Harry-Hak-Lay Chuang, Hsinchu County (TW); Sheng-Huang Huang, Hsinchu (TW); Hung-Cho Wang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 164 days.

(21) Appl. No.: 16/935,139

(22) Filed: Jul. 21, 2020

(65) Prior Publication Data

US 2022/0029093 A1 Jan. 27, 2022

(51) Int. Cl.
  *H01L 43/12* (2006.01)
  *H01L 43/02* (2006.01)
  *H01L 27/22* (2006.01)

(52) U.S. Cl.
  CPC ............ *H01L 43/12* (2013.01); *H01L 27/222* (2013.01); *H01L 43/02* (2013.01)

(58) Field of Classification Search
  CPC ....... H01L 43/12; H01L 27/222; H01L 43/02; H01L 27/228
  See application file for complete search history.

(56) References Cited

U.S. PATENT DOCUMENTS

| | | | |
|---|---|---|---|
| 2009/0166817 A1* | 7/2009 | Tsai | H01L 23/53295 257/E23.001 |
| 2009/0209050 A1* | 8/2009 | Wang | H01L 43/12 257/E21.001 |
| 2015/0104882 A1* | 4/2015 | Jung | H01L 27/222 438/3 |
| 2018/0211910 A1* | 7/2018 | Lee | H01L 27/222 |
| 2019/0165258 A1* | 5/2019 | Peng | H01L 43/08 |
| 2021/0135097 A1* | 5/2021 | Shen | H01L 43/12 |

OTHER PUBLICATIONS

Z. M. Zeng et al., Effect of resistance-area product on spin transfer switching in MgO-based magnetic tunnel junction memory cells, Appl. Phys. Lett. 98, 072512 (2011) (Year: 2011).*
Takayasu Sakurai, Closed-Form Expressions for Interconnection Delay, Coupling, and Crosstalk in VLSI's, IEEE Transactions On Electron Devices, vol. 40, No. I, Jan. 1993 (Year: 1993).*

* cited by examiner

*Primary Examiner* — Shih Tsun A Chou
(74) *Attorney, Agent, or Firm* — Maschoff Brennan

(57) ABSTRACT

A method for fabricating the semiconductor device is provided. The method includes depositing a first dielectric layer; forming a first memory cell over the first dielectric layer; depositing a second dielectric layer over the first memory cell; and forming a second memory cell over the second dielectric layer. Forming the first memory cell includes depositing a first resistance switching layer over the first dielectric layer and performing a first physical etching process to pattern the first resistance switching layer into a first resistance switching element. Forming the second memory cell includes depositing a second resistance switching layer over the second dielectric layer and performing a chemical etching process to pattern the second resistance switching layer into a second resistance switching element.

20 Claims, 19 Drawing Sheets

SEMICONDUCTOR DEVICE AND METHOD FOR FABRICATING THE SAME

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
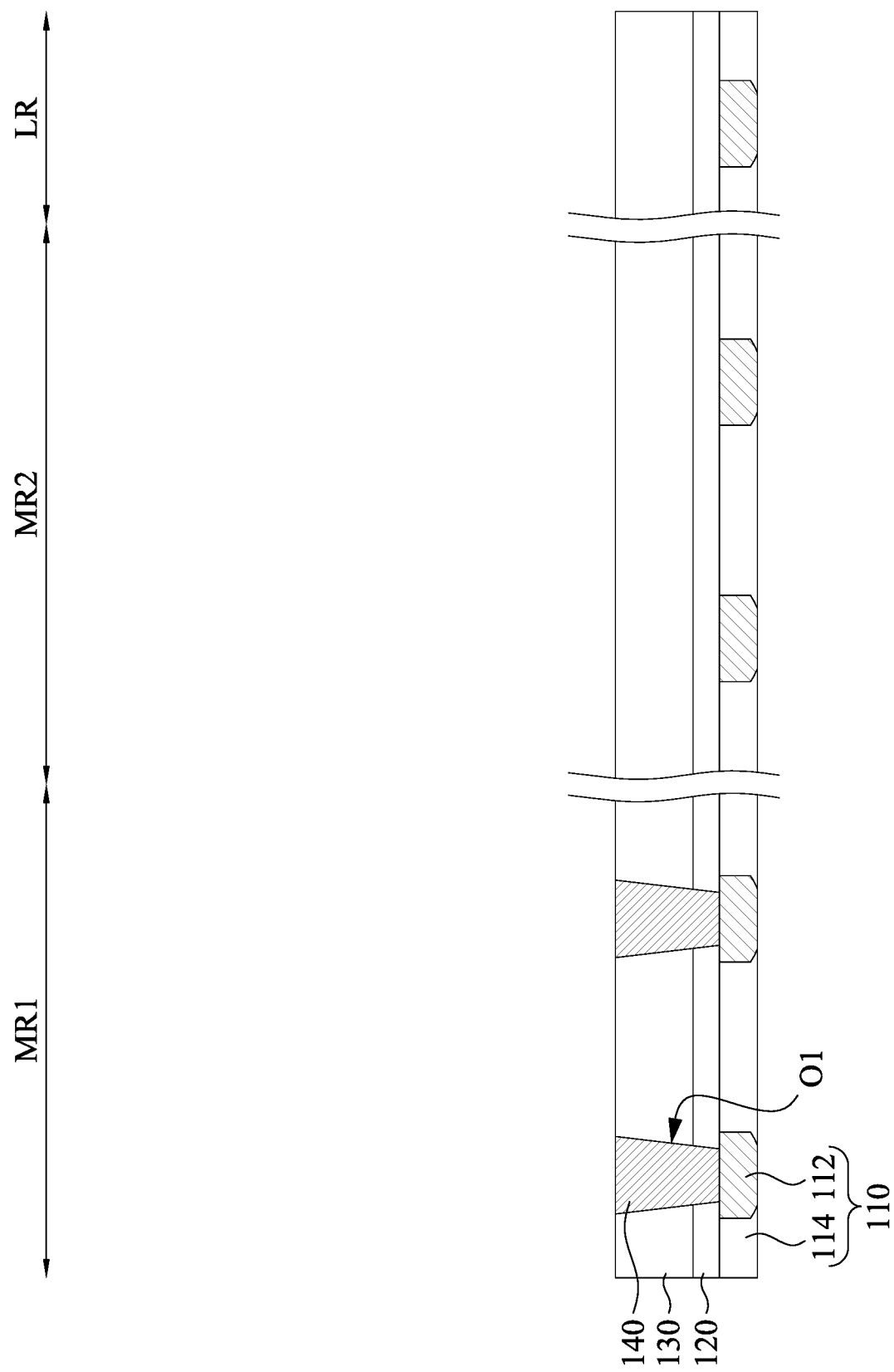
FIGS. 1-17 are cross-sectional views of a semiconductor device at various intermediate stages of manufacture according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments of this disclosure, a magnetoresistive random access memory (MRAM) device is formed. The MRAM device includes a magnetic tunnel junction (MTJ) stack. The resistance switching element includes a tunnel barrier layer formed between a ferromagnetic pinned layer and a ferromagnetic free layer. The tunnel barrier layer is thin enough (such as a few nanometers) to permit electrons to tunnel from one ferromagnetic layer to the other. A resistance of the resistance switching element is adjusted by changing a direction of a magnetic moment of the ferromagnetic free layer with respect to that of the ferromagnetic pinned layer. When the magnetic moment of the ferromagnetic free layer is parallel to that of the ferromagnetic pinned layer, the resistance of the resistance switching element is in a lower resistive state, corresponding to a digital signal "0". When the magnetic moment of the ferromagnetic free layer is anti-parallel to that of the ferromagnetic pinned layer, the resistance of the resistance switching element is in a higher resistive state, corresponding to a digital signal "1". The resistance switching element is coupled between top and bottom electrodes and an electric current flowing through the resistance switching element (tunneling through the tunnel barrier layer) from one electrode to the other is detected to determine the resistance and the digital signal state of the resistance switching element.

Embodiments of the disclosure include manufacturing methods using dry etching processes to pattern the resistance switching element of the memory cells. The mechanism for dry etching can be through chemical reactions that consume the material using chemically reactive gas plasmas, physical removal that removes the material by momentum transfer between gas molecules, or a combination of both physical removal and chemical reactions. Plasma etching is an example of a pure chemical dry etching technique. Reactive ion etching (RIE) is an example of dry etching that employs both physical and chemical processes. Physical sputtering and ion beam etching (IBE) are examples of pure physical dry etching techniques. In some embodiments, pure physical dry etching techniques (e.g., ion beam etching (IBE)) are used to fabricate some memory cells having smaller resistance switching elements. The memory cells having smaller resistance switching elements may be applicable for quick reading/programming operations, thereby achieving fast switching. In some embodiments, pure chemical etching techniques (e.g., plasma etching) or dry etching techniques that employs both physical and chemical etching techniques (e.g., RIE) are used to fabricate some memory cells having larger resistance switching elements. The memory cells having larger resistance switching elements may be applicable for holding saved data for long term.

According to some embodiments of this disclosure, the memory cells having smaller resistance switching elements and the memory cells having larger resistance switching elements are formed within a chip region of a substrate. A plurality of semiconductor chip regions is marked on the substrate by scribe lines between the chip regions. The substrate will go through a variety of cleaning, layering, patterning, etching and doping steps to form the MRAM devices. The term "substrate" herein generally refers to a bulk substrate on which various layers and device elements are formed. In some embodiments, the bulk substrate includes silicon or a compound semiconductor, such as GaAs, InP, SiGe, or SiC. Examples of the layers include dielectric layers, doped layers, polysilicon layers or conductive layers. Examples of the device elements include transistors, resistors, and/or capacitors, which may be interconnected through an interconnect layer to additional integrated circuits.

FIG. 1 illustrates a wafer having a substrate 110 thereon. The substrate 110 has a logic region LR where logic circuits are to be formed and memory regions MR1 and MR2 where memory cells are to be formed. The substrate 110 includes an interlayer dielectric (ILD) layer or inter-metal dielectric (IMD) layer 114 with a metallization pattern 112 over the logic region LR and the memory regions MR1 and MR2. The ILD layer 114 may be silicon oxide, fluorinated silica glass (FSG), carbon doped silicon oxide, tetra-ethyl-orthosilicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization pattern 112 may be aluminum, aluminum alloy, copper, copper alloy, titanium, titanium nitride, tantalum, tantalum nitride, tungsten, cobalt, the like, and/or combinations thereof. Formation of the metallization pattern 112 and the ILD layer 114 may be a dual-damascene process and/or a single-damascene process. The substrate 110 may also include active and passive devices, for example, underlying the ILD layer 114. These further components are omitted from the figures for clarity.

An etch stop layer 120 and a dielectric layer 130 are formed over the logic region LR and the memory regions MR1 and MR2 of the substrate 110 in a sequence. The etch stop layer 120 may have a high etch resistance to one or more subsequent etching processes. The etch stop layer 120 may be formed of dielectric material different from the underlying ILD layer 114. For example, the ILD layer 114 may be a silicon oxide layer, and the etch stop layer 120 may be a silicon nitride layer.

The dielectric layer 130 in some embodiments is silicon carbide (SiC), silicon oxynitride (SiON), silicon nitride (SiN), silicon dioxide, TEOS, low-k dielectrics, black diamond, FSG, PSG, BPSG, the like, and/or combinations thereof. The dielectric layer 130 may be a single-layered structure or a multi-layered structure. The dielectric layer 130 may be formed by acceptable deposition techniques, such as chemical vapor deposition (CVD), atomic layer deposition (ALD), physical vapor deposition (PVD), the like, and/or a combination thereof.

Openings O1 are formed in the etch stop layer 120 and the dielectric layer 130 in the memory region MR1, and exposes portions of the metallization pattern 112. An exemplary formation method of the openings O1 includes forming a patterned mask over the dielectric layer 130, and then etching the dielectric layer 130 and the etch stop layer 120 through the patterned mask by one or more etching processes, such as dry etching, wet etching, or combinations thereof. After the formation of the openings O1, the patterned mask is removed from the dielectric layer 130 by suitable ashing process.

Bottom electrode vias (BEVA) 140 are then formed within the openings O1. In some embodiments, at least one of the BEVAs 140 is a multi-layered structure and includes, for example, a diffusion barrier layer and a filling metal filling a recess in the diffusion barrier layer. An exemplary formation method of the BEVAs 140 includes forming in sequence the diffusion barrier layer and the filling metal into the openings O1, and performing a planarization process, such as a chemical-mechanical polish (CMP) process, to remove excess materials of the filling metal and of the diffusion barrier layer outside the openings O1. The remaining diffusion barrier layer and the remaining filling metal in the openings O1 can serve as the BEVAs 140. In some embodiments, the BEVAs 140 are electrically connected to an underlying electrical component, such as a transistor, through the metallization pattern 112.

In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the filling metal is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using CVD, PVD, ALD, the like, and/or a combination thereof.

Figure 2:
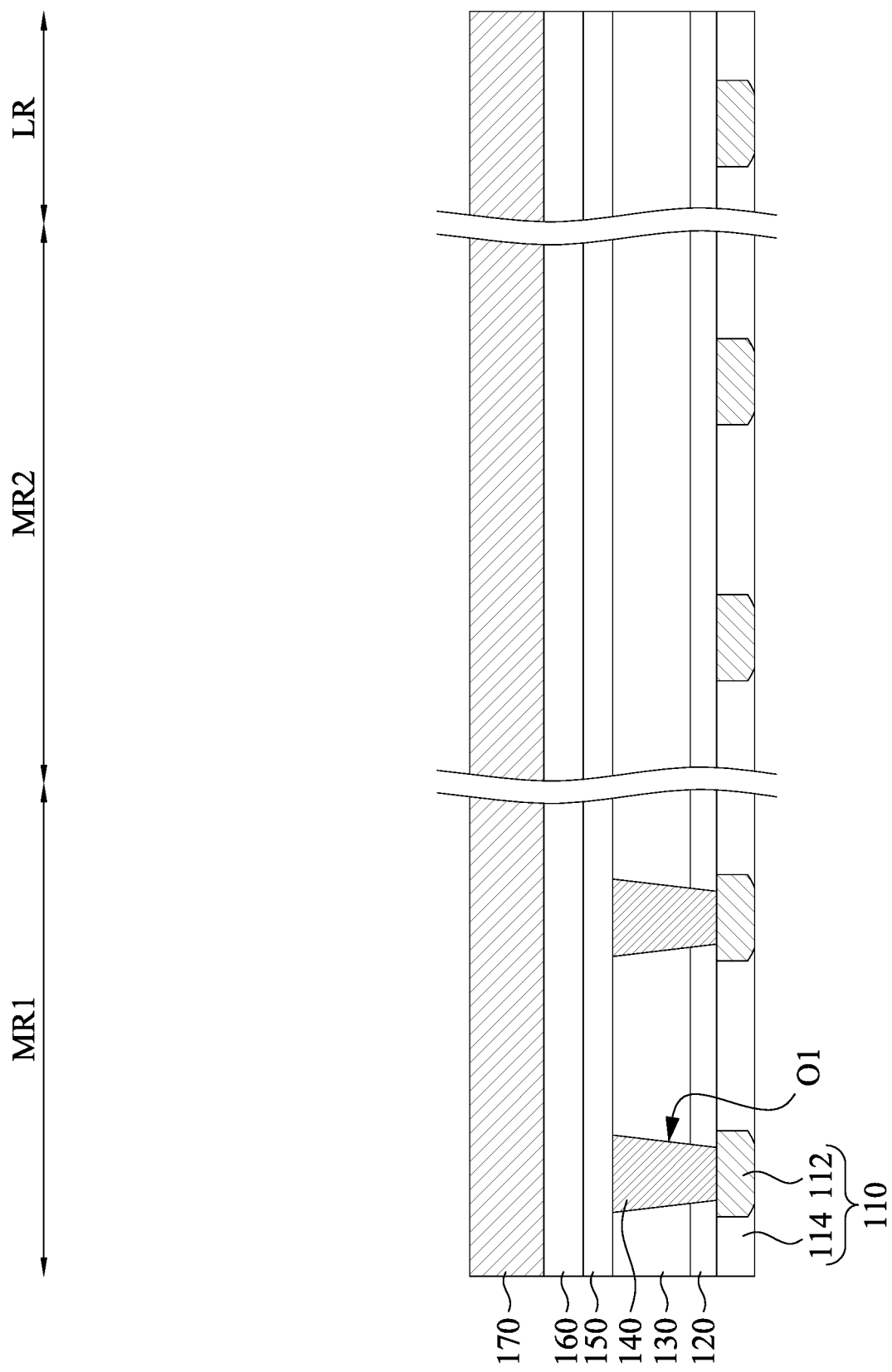

Reference is made to FIG. 2. A bottom electrode layer 150 is then blanketly formed over the BEVAs 140 and over the dielectric layer 130, so that the bottom electrode layer 150 extends along top surfaces of the BEVAs 140 and of the dielectric layer 130. The bottom electrode layer 150 can be a single-layered structure or a multi-layered structure. In some embodiments, the bottom electrode layer 150 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 150 may be exemplarily performed using CVD, PVD, ALD, the like, and/or a combination thereof.

A resistance switching layer 160 is formed over the bottom electrode layer 150. In some embodiments, the resistance switching layer 160 may be a magnetic tunnel junction (MTJ) structure. To be specific, the resistance switching layer 160 includes at least a first magnetic layer, a tunnel barrier layer and a second magnetic layer formed in sequence over the bottom electrode layer 150. The magnetic moment of the second magnetic layer may be programmed causing the resistance of the resulting MTJ cell to be changed between a high resistance and a low resistance.

In some embodiments, the first magnetic layer includes an anti-ferromagnetic material (AFM) layer over the bottom electrode layer 150 and a ferromagnetic pinned layer over the AFM layer. In the anti-ferromagnetic material (AFM) layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD or the like.

The ferromagnetic pinned layer in the first magnetic layer forms a permanent magnet and exhibits strong interactions with magnets. A direction of a magnetic moment of the ferromagnetic pinned layer can be pinned by an anti-ferromagnetic material (AFM) layer and is not changed during operation of a resulting resistance switching element fabricated from the resistance switching layer 160. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, thermal or e-beam evaporated deposition. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element fabricated from the resistance switching layer 160. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporated deposition, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron, compound or alloy thereof. An exemplary formation method of the second magnetic layer includes sputtering, PVD, ALD, e-beam or thermal evaporated deposition, or the like.

A top electrode layer 170 is formed over the resistance switching layer 160. The top electrode layer 170 includes a conductive material. In some embodiments, the top electrode layer 170 is similar to the bottom electrode layer 150 in terms of composition. In some embodiments, the top electrode layer 170 comprises titanium (Ti), tantalum (Ta), platinum (Pt), ruthenium (Ru), tungsten (W), aluminum (Al), copper (Cu), the like or combinations thereof. An exemplary formation method of the top electrode layer 170 includes sputtering, PVD, ALD or the like.

Figure 3:
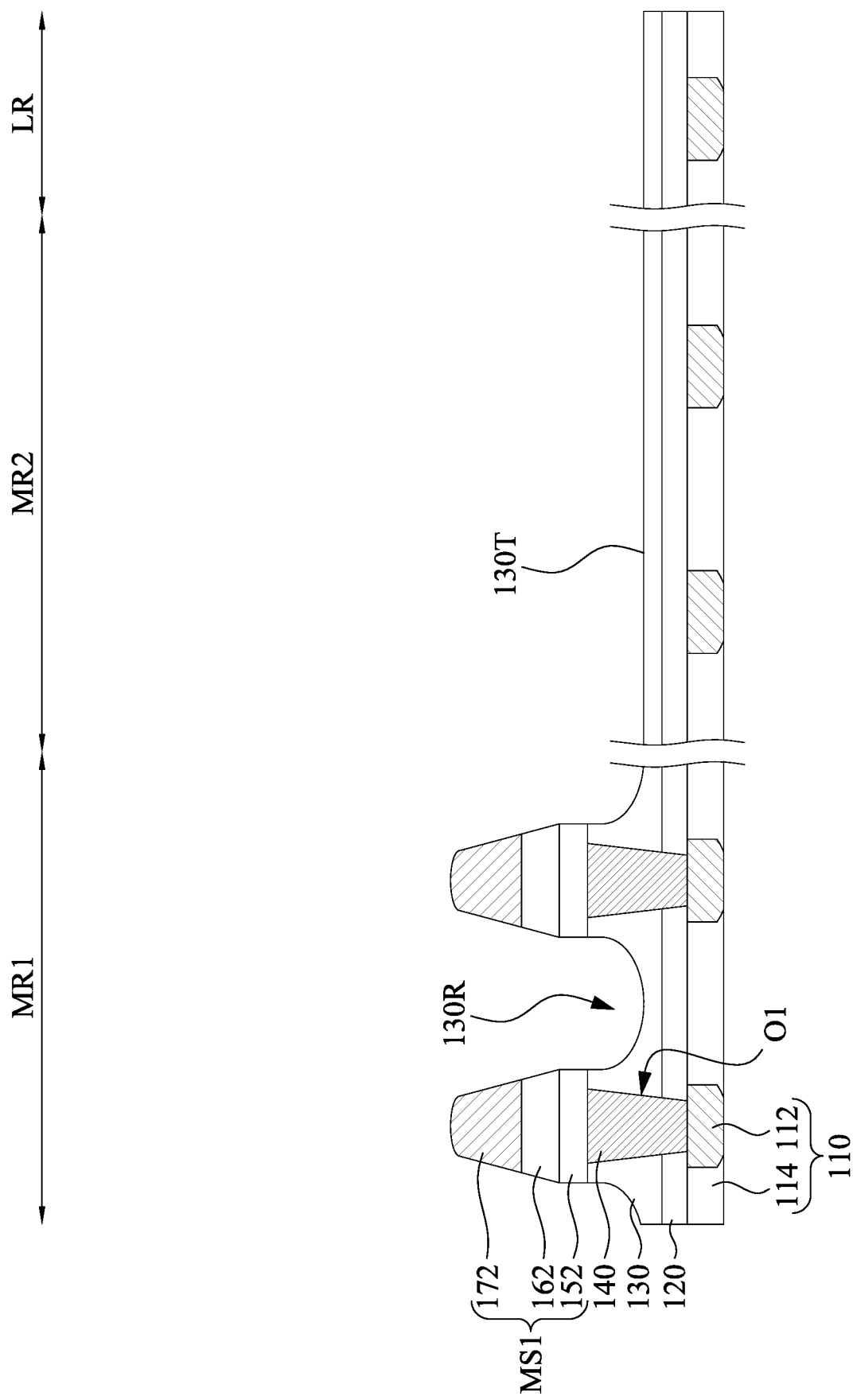

Reference is made to FIG. 3. The top electrode layer 170, the resistance switching layer 160, and the bottom electrode layer 150 (referring to FIG. 2) are patterned into top electrodes 172, resistance switching elements 162, and bottom electrodes 152 in the memory region MR1. The top electrodes 172, the resistance switching elements 162, and the bottom electrodes 152 in combination may be referred to as memory stacks MS1. In the present embodiments, the patterning may include a directional physical dry etching process, such as IBE process. The IBE process may use an etchant gas such as a CHF series (e.g., $CHF_2$, $CHF_3$, $CF_4$, $CH_xF_y$, or $CH_3OH$), Kr, Ne, Ar, O, N, the like, or a combination thereof. The IBE process may be performed in a chamber with a rotatable stage or substrate table with more than one axis of rotation. This rotation allows a more uniform etch profile and allows control of the angle of incidence of the ion beam. The IBE process may have an end point detection system to allow the etching process to stop before etching through the underlying dielectric layer 130.

In some embodiments, the IBE process may be performed with a high power to cut the layers 150-170 (referring to FIG. 2). For example, the power of the IBE process may be in a range from about 100V to about 600V. Through the IBE process, sidewalls of one of the top electrodes 172, one of the resistance switching elements 162, one of the bottom electrodes 152 are substantially aligned with each other. In some embodiments, the physical dry etching process may etch the underlying dielectric layer 130, thereby forming recesses 130R in the dielectric layer 130. In some embodiments, the recesses 130R in the dielectric layer 130 are designed to be deep enough to reduce the amount of redeposition films on sidewalls of MTJ during the IBE process. For example, in some embodiments, a thickness of the dielectric layer 130 is in a range from about 40 nanometers to about 70 nanometers, and a depth of the recess 130R may be in a range from about 20 nanometers to about 50 nanometers. If the thickness of the dielectric layer 130 is less than 40 nanometers, the IBE process performed to form the resistance switching elements 162 without the redeposition films may etch through the dielectric layer 130, such that the recess 130R may expose underlying etch stop layer. If the thickness of the dielectric layer 130 is greater than 70 nanometers, due to the limited thickness of the ILD layer subsequently formed (e.g., the ILD layer 200 in FIG. 7), a portion of the ILD layer subsequently formed (e.g., the ILD layer 200 in FIG. 7) above the top electrode 172 may be too thin, which may result in difficulty in the formation of the top electrode via (e.g., the conductive feature 210 in FIG. 8). The BEVA 140 may have a height in a range from about 40 nanometers to about 70 nanometers according to the thickness of the dielectric layer 130. The IBE process may also lower a top surface of the dielectric layer 130 in the regions MR2 and LR.

In some cases where the resistance switching layer is patterned by other etching process (e.g., chemical dry etching process), dead layers may be formed on sidewalls of the resistance switching elements, which may result in the need of roll-off process for removing the dead layers from the resistance switching elements. In some embodiments of the present disclosure, the physical dry etching process (e.g., IBE process) would not result in dead layers at sidewall of the resistance switching elements 162, thereby saving the roll-off process for removing the dead layers from the resistance switching elements 162 (e.g., etching dead layer), which in turn will enlarge the magneto-resistance (TMR) and read window.

A width of the resistance switching elements 162 may be in a range from about 20 nanometers to about 75 nanometers. If the width of the resistance switching elements 162 is less than about 20 nanometers, magneto-resistance (TMR) may become worse, and the window between "0" and "1" may be too narrow. If the width of the resistance switching elements 162 is greater than about 75 nanometers, it takes more time for reading/programming operation, such that the formed memory cell may not achieve fast switching.

Figure 4:
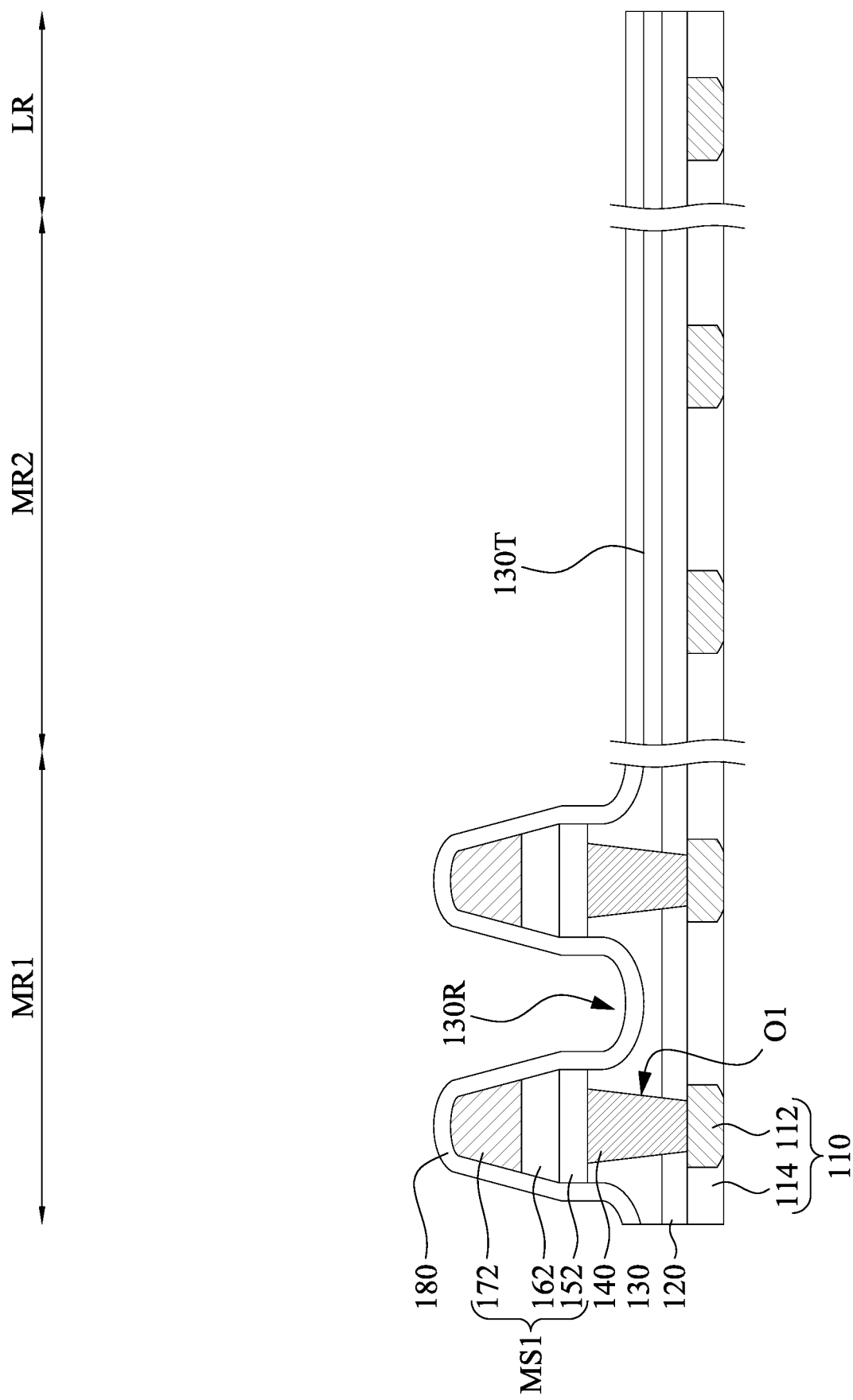

Reference is then made to FIG. 4. A spacer layer 180 is deposited over the memory stacks MS1 and the dielectric layer 130. The spacer layer 180 in some embodiments may include SiN, but in other embodiments may include SiC, SiON, silicon oxycarbide (SiOC), the like, and/or combinations thereof. The spacer layer 180 may be formed using CVD, PVD, ALD, the like, and/or combinations thereof.

Figure 5:
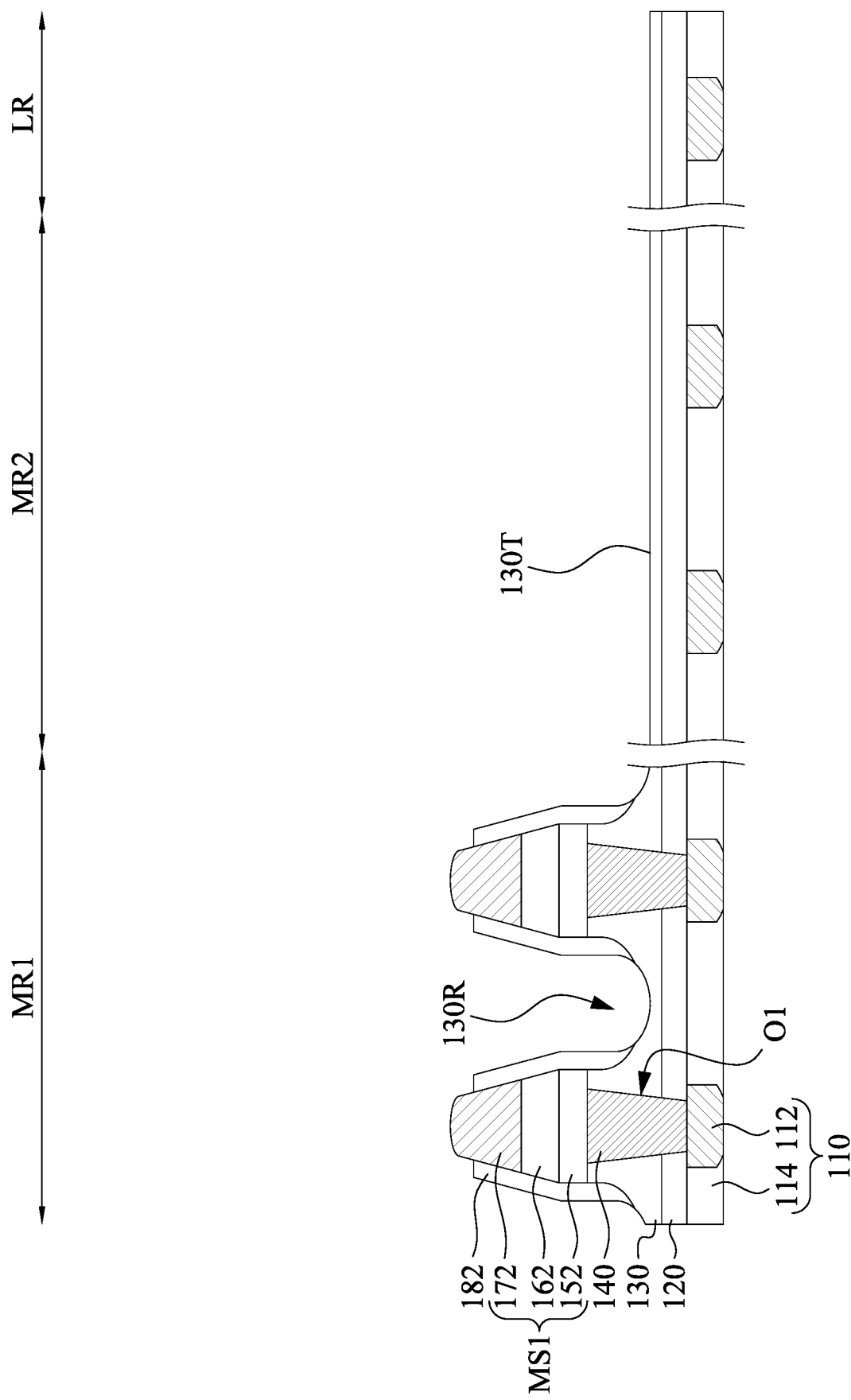

Reference is then made to FIG. 5. The spacer layer 180 (referring to FIG. 4) is patterned into spacers 182 by suitable etching process. The etching process may be anisotropic dry etching process (e.g., plasma etching process), using gas etchants such as $CH_2F_2$, $CF_4$, $CH_xF_y$, $CHF_3$, $CH_4$, $N_2$, $O_2$, Ar, He, or the like. The etching process removes horizontal portions of the spacer layer 180 (referring to FIG. 4), and leaving vertical portions of the spacer layer 180 (referring to FIG. 4) on sidewalls of the memory stacks MS1 and the dielectric layer 130. The remaining vertical portions of the spacer layer 180 (referring to FIG. 4) may be referred to as the spacer 182 hereinafter. In some embodiments, the spacers 182 are respectively formed around and enclose the resistance switching elements 162. The spacer 182 may include multiple layers in some embodiments. In some embodiments, the dielectric layer 130 may have a higher etch resistance to the etching process than that of the spacer 182, such that the etching process to the spacer layer 180 (referring to FIG. 4) may stop at the top surface of the dielectric layer 130. After the etching process, portions of the top electrodes 172 are exposed by the spacers 182. In some embodiments, the etching process may further lower the top surface 130T of the dielectric layer 130 and deepen the recess 130R.

Figure 6:
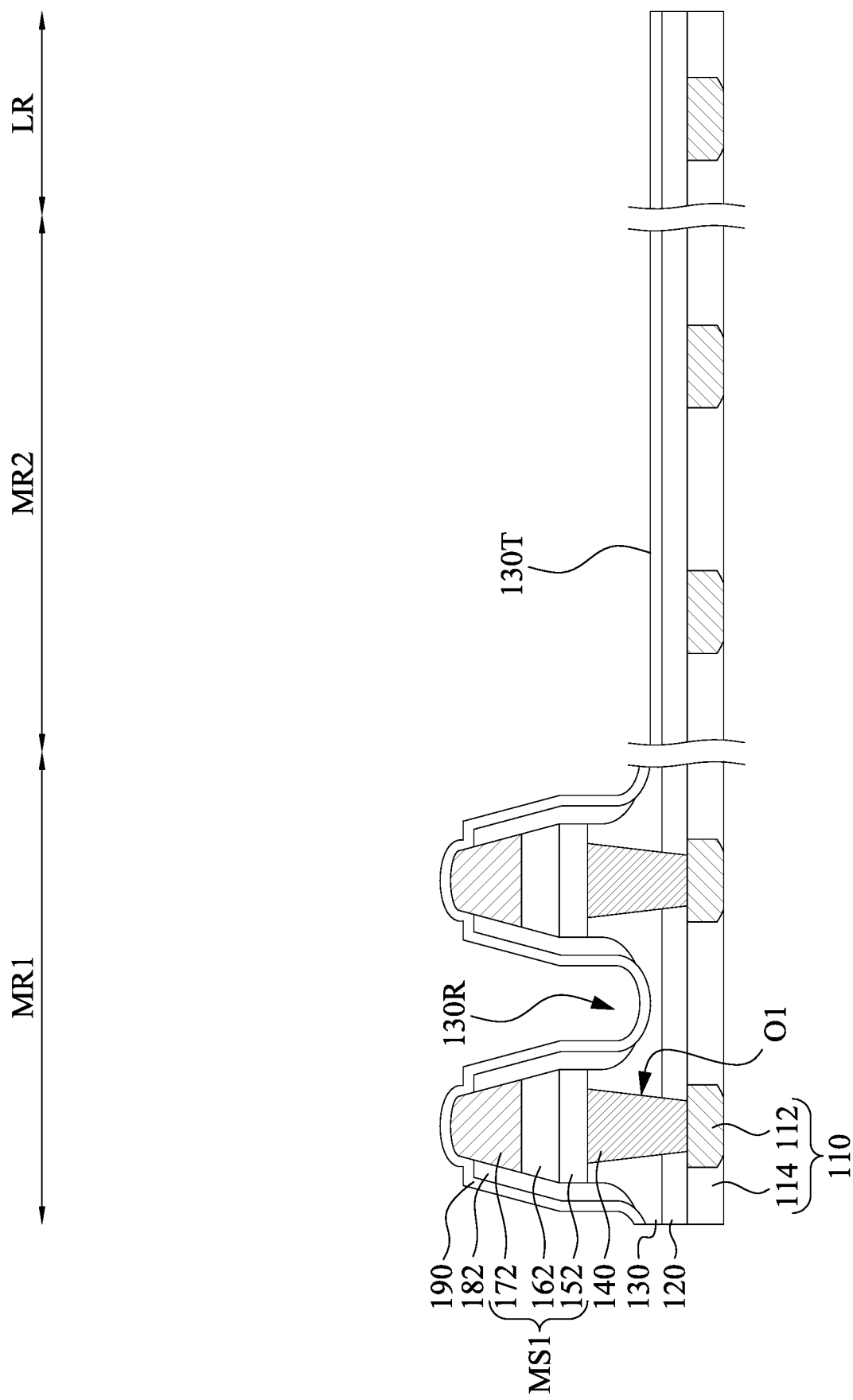

Reference is then made to FIG. 6. A protective layer 190 is deposited over the spacer 182, the memory stacks MS1, the dielectric layer 130. The protective layer 190 may be formed of dielectric material different from the etch stop layer 120, the dielectric layer 130, and the spacers 182. In some embodiments, the protective layer 190 may be a metal-containing compound layer. For example, the protective layer 190 is made from $AlO_x$, AlN, $AlN_yO_x$, other suitable material, or the combination thereof. In some other embodiments, the protective layer 190 may be a metal oxide layer containing other metals. In some other embodiments, the protective layer 190 may be dielectric layer, such as silicon nitride layer. In some embodiments, the protective layer 190 can be a single layer or a multi-layered structure.

After the deposition of the protective layer 190, a portion of the protective layer 190 out of the memory region MR1 may be removed by suitable etching process. For example, a etch mask may be formed over the memory region MR1 and exposing the memory region MR2 and the logic region LR, and then the etching process is performed to remove the portion of the protective layer 190 in the memory region MR2 and the logic region LR through the etch mask. The etching process may use an etchant gas such as $Cl_2$, $BCl_3$, or the like, or a combination thereof. The etching process may further remove a portion of the dielectric layer 130 in the memory region MR2 and the logic region LR, thereby lowering the top surface 130T of the dielectric layer 130 in the memory region MR2 and the logic region LR. In some other embodiments, the etching process may remove a portion of the dielectric layer 130 out of the memory region MR1, such that a top surface of the etch stop layer 120 in the memory region MR2 and the logic region LR are exposed after the etching process.

Figure 7:
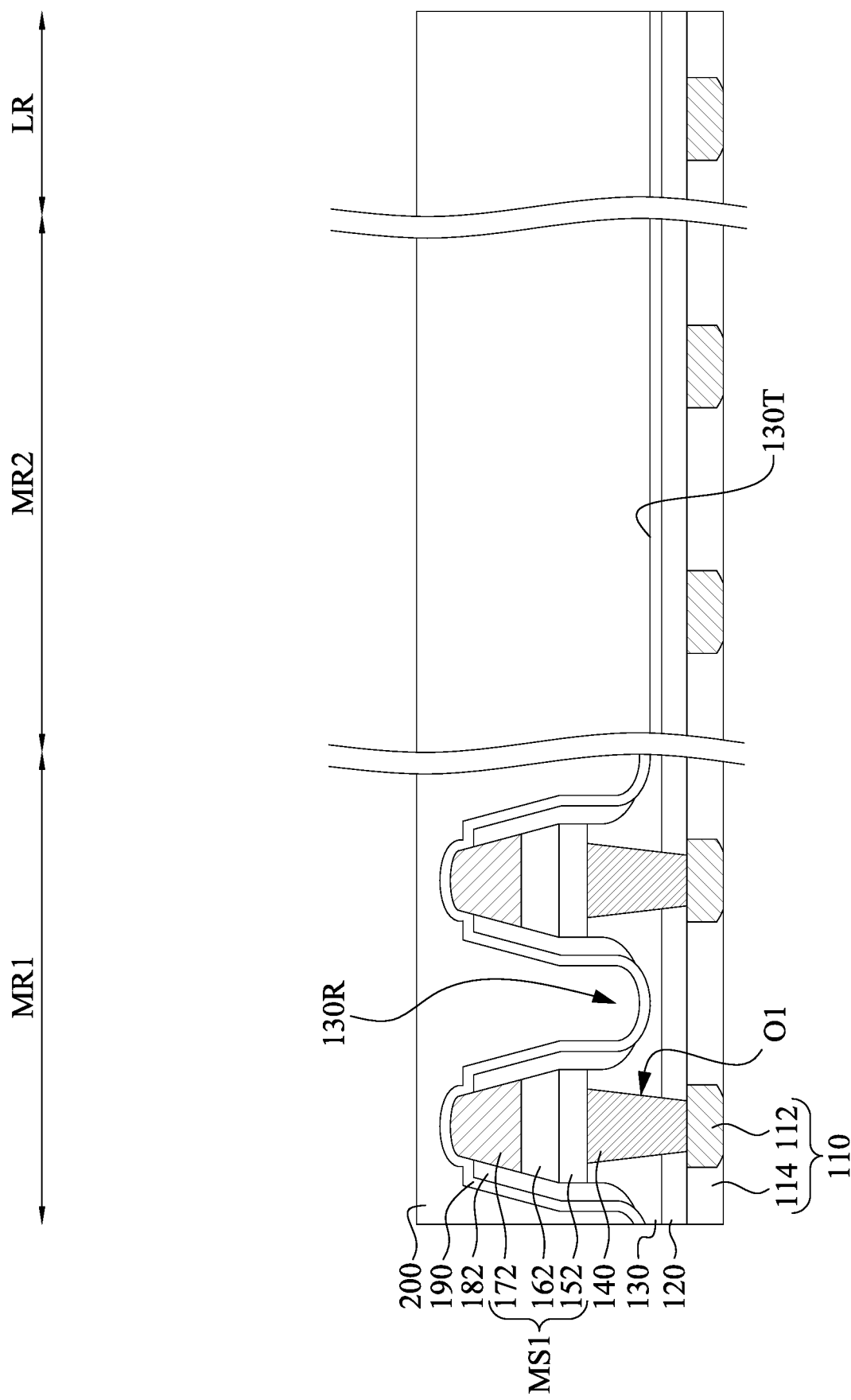

Reference is made to FIG. 7. An ILD layer 200 is formed over the substrate 110. In some embodiments, the ILD layer 200 may have the same material as the ILD layer 114. In some other embodiments, the ILD layer 200 may have a different material than the ILD layer 114. In some embodiments, the ILD layer 200 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. After the formation of the ILD layer 200, a planarization process may be performed to a top surface of the ILD layer 200, such that the top surface of the ILD layer 200 is planarized. The planarization process may include a CMP process.

Figure 8:
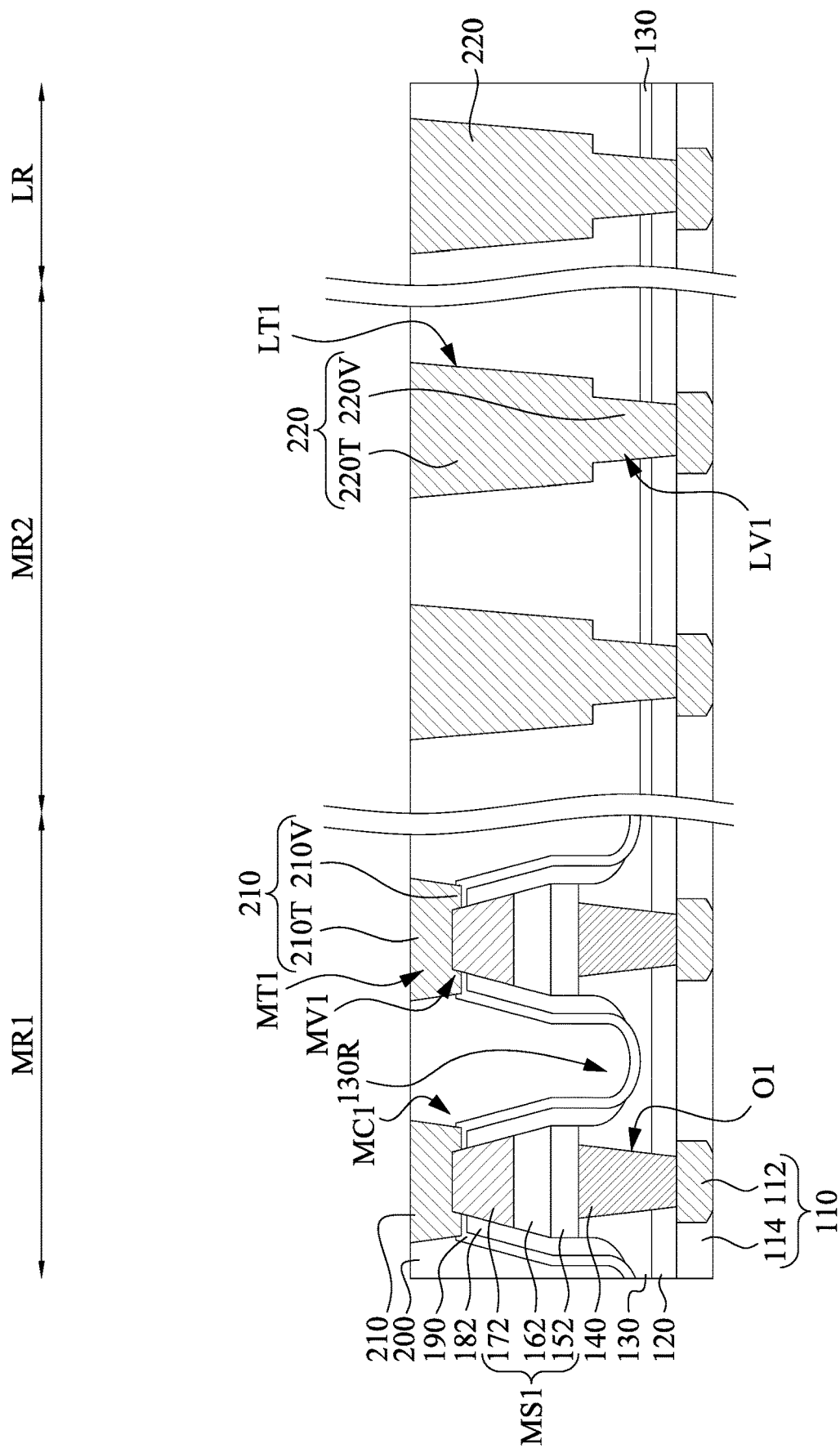

Reference is made to FIG. 8. A metallization pattern is then formed in the ILD layer 200. The metallization pattern may include conductive features 210 (e.g., top electrode via 210V and metal lines 210T) in the memory region MR1 and conductive features 220 (e.g., conductive via 220V and metal lines 220T) in the memory region MR2 and the logic region LR. Formation of the metallization pattern may include a via etching process, a trench etching process, a liner removal process, and a metal filling process. The via etching process may be performed to etch vias openings MV1 in the ILD layer 200 in the memory region MR1 and etch via openings LV1 in the ILD layer 200 and dielectric layer 130 in the regions MR2 and LR. The trench etching process may be performed to etch trenches MT1 in the ILD layer 200 in the memory region MR1, etch trenches LT1 in the ILD layer 200 in the regions MR2 and LR, and deepen the vias openings MV1 and LV1 after the via etching process. The via etching process and the trench etching process may be suitable anisotropic etching processes. In some embodiments where the ILD layer 200 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. The liner removal process may be performed to slope the sidewalls of the via openings MV1 and LV1 and remove a portion of the etch stop layer 120 exposed by the via opening LV1. The liner removal process may include one or more isotropic etching processes, such as dry etching processes using $CH_2F_2$ and Ar as etching gases.

In some embodiments, in the region MR1, the protective layer 190 may have a higher etch resistance to the via and trench etching processes than that of the ILD layer 200, such that the via and trench etching processes may stop at the protective layer 190. After the via and trench etching processes, a cleaning process may be performed to remove residue polymers. The cleaning process may use suitable wet liquid, such as acid liquid. The cleaning process may consume and remove a portion of the protective layer 190 exposed by the via openings MV1, thereby exposing the top electrodes 172. In some embodiments, the top electrodes 172 may have a higher resistance to the cleaning process than that of the protective layer 190, such that the cleaning process may stop at the top electrodes 172 and not damage the underlying layers.

In some embodiments, in the regions MR2 and LR, the etch stop layer 120 may have a higher etch resistance to the via and trench etching processes than that of the ILD layer 200 and the dielectric layer 130, such that the via and trench etching processes may stop at the etch stop layer 120. The liner removal process may remove a portion of the etch stop layer 120 exposed by the via opening LV1 and expose the underlying metallization pattern 112. In some embodiments, the metallization pattern 112 may have a higher etch resistance to the liner removal process than that of the etch stop layer 120, such that the liner removal process may stop at the conductive features 210 and not damage the underlying layers.

The metal filling process is performed to fill one or more metals (e.g., copper) in the via openings MV1 and LV1 and the trenches MT1 and LT1 to form the metallization pattern. After the openings and trenches are filled with metals, a planarization is performed to remove an excess portion of the metals outside the openings, and therefore forming the top electrode via 210V, metal lines 210T, conductive via 220V, and metal lines 220T.

Through the configuration, plural memory cells MC1 are formed. In some embodiments, each of the memory cells MC1 includes a resistance switching element 162, a top electrode 172 over the resistance switching element 162, and a bottom electrode 152 under the resistance switching element 162, a BEVA 140 under the bottom electrode 152, and a conductive feature 210 over the top electrode 172. Through the configuration, the memory cells MC1 have a small resistance switching elements 162, such that the memory cells MC1 have the capability to being programmed and read, quickly, thereby achieving fast switching, which in turn allows the memory cells MC1 behave as RAM-like.

In some embodiments, the BEVAs 140 are surrounded the etch stop layer 120 and the dielectric layer 130. In some embodiments, the etch stop layer 120 and the dielectric layer 130 extend across the logic region LC and the memory regions MR1 and MR2. In some embodiments, the protective layer 190 surrounds the memory cell MR1 in the memory region MR1 and terminates prior to reach the logic region LR and the memory region MR2.

Figure 9:
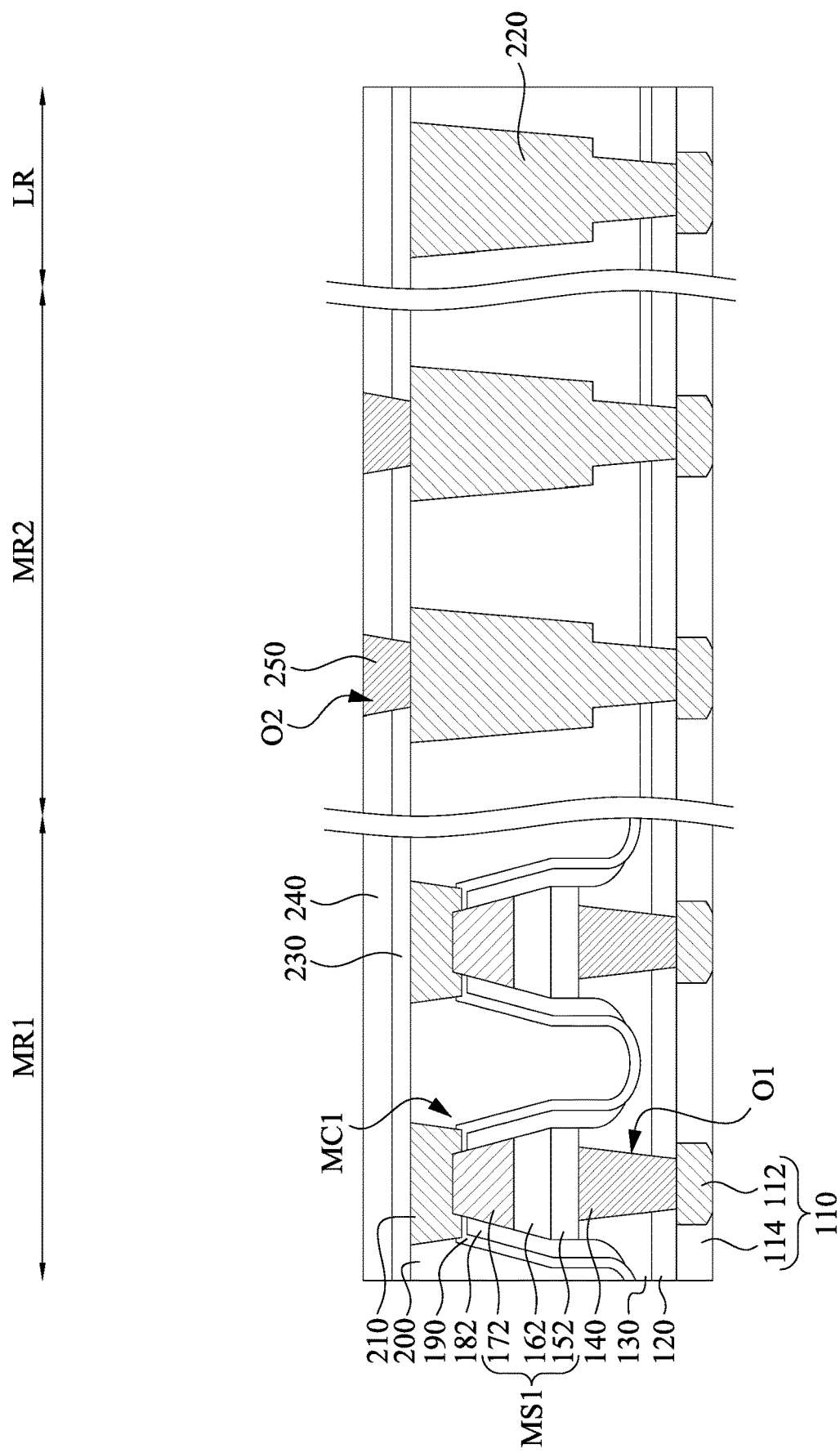

Reference is made to FIG. 9. An etch stop layer 230 and a dielectric layer 240 are formed over the logic region LR and the memory regions MR1 and MR2 of the substrate 110 in a sequence. The etch stop layer 230 may have a high etch resistance to one or more subsequent etching processes. The etch stop layer 230 may be formed of dielectric material different from the underlying ILD layer 200. For example, the ILD layer 200 may be a silicon oxide layer, and the etch stop layer 230 may be a silicon nitride layer. The dielectric layer 240 in some embodiments is silicon carbide (SiC), silicon oxynitride (SiON), silicon nitride (SiN), silicon dioxide, TEOS, low-k dielectrics, black diamond, FSG, PSG, BPSG, the like, and/or combinations thereof. The dielectric layer 240 may be a single-layered structure or a multi-layered structure. The dielectric layer 240 may be formed by acceptable deposition techniques, such as chemical vapor deposition (CVD), atomic layer deposition (ALD), physical vapor deposition (PVD), the like, and/or a combination thereof. In some embodiments of the present disclosure, a thickness of the dielectric layer 130 is thicker than a thickness of the dielectric layer 240.

Openings O2 are formed in the etch stop layer 230 and the dielectric layer 240 in the memory region MR1, and exposes portions of the conductive features 220. An exemplary formation method of the openings O2 includes forming a patterned mask over the dielectric layer 240, and then etching the dielectric layer 240 and the etch stop layer 230 through the patterned mask by one or more etching processes, such as dry etching, wet etching, or combinations thereof. After the formation of the opening O2, the patterned mask may be removed from the dielectric layer 240, for example, by ashing process.

BEVAs 250 are then formed within the openings O2. In some embodiments, at least one of the BEVAs 250 is a multi-layered structure and includes, for example, a diffusion barrier layer and a filling metal filling a recess in the diffusion barrier layer. An exemplary formation method of the BEVAs 250 includes forming in sequence the diffusion barrier layer and the filling metal into the openings O2, and performing a planarization process, such as a chemical-mechanical polish (CMP) process, to remove excess materials of the filling metal and of the diffusion barrier layer outside the openings O2. The remaining diffusion barrier layer and the remaining filling metal in the openings O2 can serve as the BEVAs 250. In some embodiments, the BEVAs 250 are electrically connected to an underlying electrical component, such as a transistor, through the conductive features 220.

In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the filling metal is titanium (Ti), tantalum (Ta), platinum (Pt), ruthenium (Ru), tungsten (W), aluminum (Al), copper (Cu), the like, and/or combinations thereof. Formation of the filling metal may be exemplarily performed using CVD, PVD, ALD, the like, and/or a combination thereof.

Figure 10:
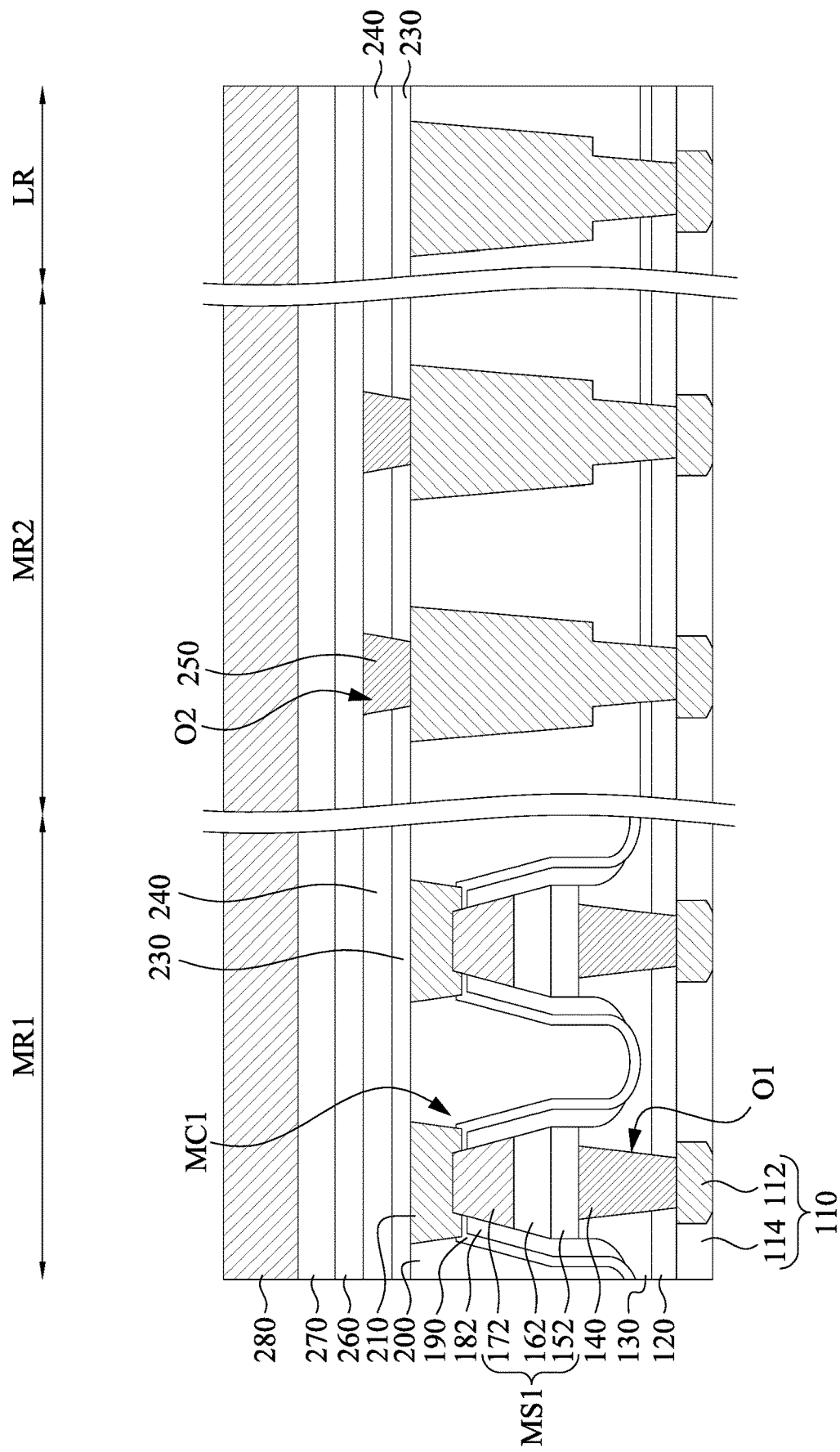

Reference is made to FIG. 10. A bottom electrode layer 260 is then blanketly formed over the BEVAs 250 and over the dielectric layer 240, so that the bottom electrode layer 260 extends along top surfaces of the BEVAs 250 and of the dielectric layer 240. The bottom electrode layer 260 can be a single-layered structure or a multi-layered structure. In some embodiments, the bottom electrode layer 260 is titanium (Ti), tantalum (Ta), platinum (Pt), ruthenium (Ru), tungsten (W), aluminum (Al), copper (Cu), TiN, TaN, the like, and/or a combination thereof. Formation of the bottom electrode layer 260 may be exemplarily performed using CVD, PVD, ALD, the like, and/or a combination thereof.

A resistance switching layer 270 is formed over the bottom electrode layer 260. In some embodiments, the resistance switching layer 270 may be a magnetic tunnel junction (MTJ) structure. To be specific, the resistance switching layer 270 includes at least a first magnetic layer, a tunnel barrier layer and a second magnetic layer formed in sequence over the bottom electrode layer 260. The magnetic moment of the second magnetic layer may be programmed causing the resistance of the resulting MTJ cell to be changed between a high resistance and a low resistance. The materials of the resistance switching layer 270 may be similar to those mentioned with respect to the resistance switching layer 160 (referring to FIG. 2), and therefore not repeated herein. In some embodiments, a thickness of the resistance switching layer 270 may be similar to that of the resistance switching layer 160 (referring to FIG. 2). In some embodiments, a thickness of the resistance switching layer 270 may different from that of the resistance switching layer 160 (referring to FIG. 2).

A top electrode layer 280 is formed over the resistance switching layer 270. The top electrode layer 280 includes a conductive material. In some embodiments, the top electrode layer 280 is similar to the bottom electrode layer 260 in terms of composition. In some embodiments, the top electrode layer 280 comprises titanium (Ti), tantalum (Ta), platinum (Pt), ruthenium (Ru), tungsten (W), aluminum (Al), copper (Cu), the like or combinations thereof. An exemplary formation method of the top electrode layer 170 includes sputtering, PVD, ALD or the like.

Figure 11:
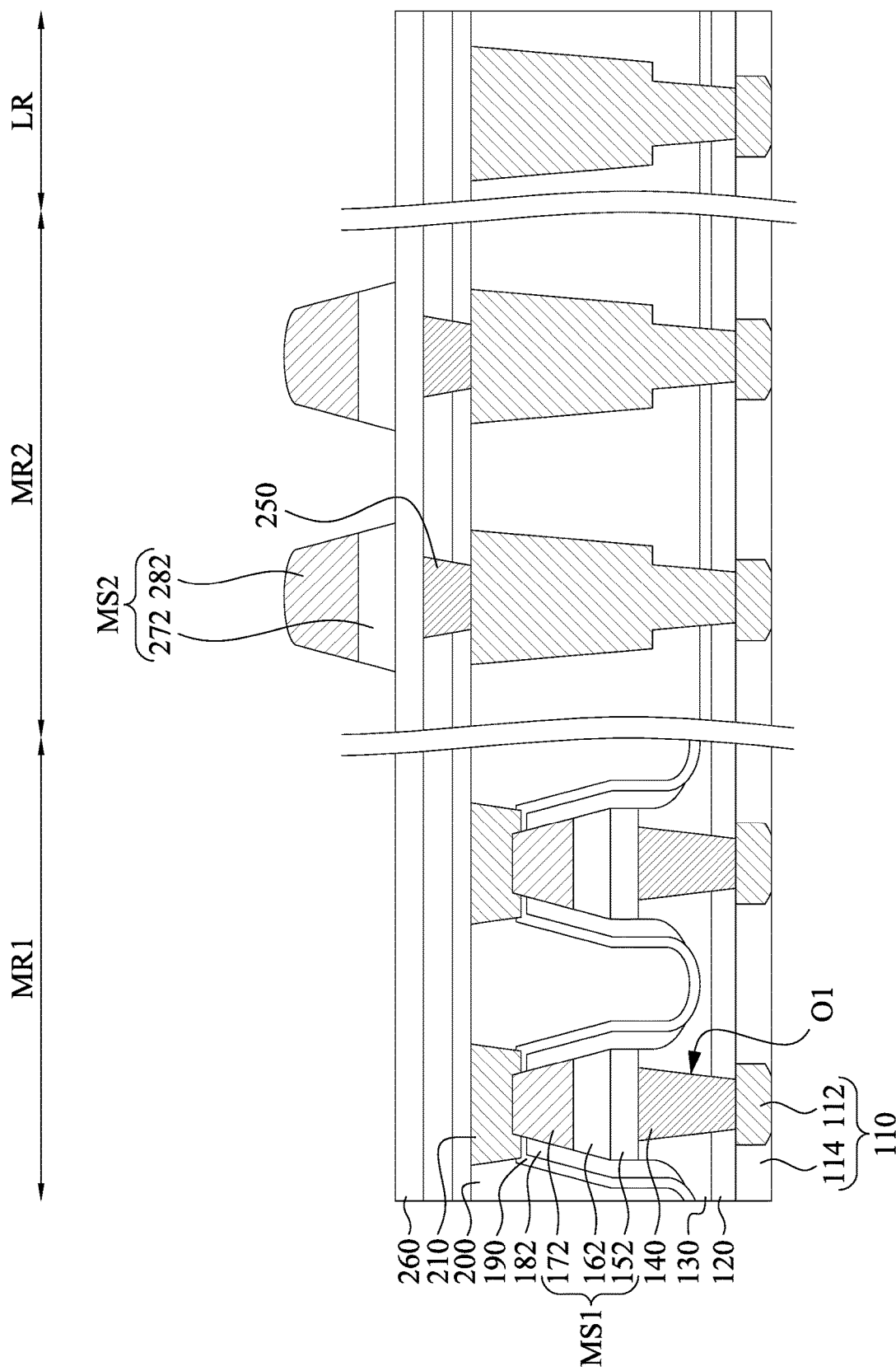

Reference is made to FIG. 11. The top electrode layer 280 and the resistance switching layer 270 (referring to FIG. 10) are patterned into top electrodes 282 and resistance switching elements 272 in the memory region MR2. The top electrodes 282 and the resistance switching elements 272 in combination may be referred to as memory stacks MS2. The patterning may include a first etching process and a second etching process. In the present embodiments, the first etching process is performed to pattern the top electrode layer 280 into the top electrodes 282. The first etching process may be a dry etch. The first etching process may use fluoride-based etchants, such as $CF_4$. Subsequently, the second etching process is performed to remove portions of the resistance switching layer 270 (referring to FIG. 10) not covered by the top electrodes 282, thereby patterning the resistance switching layer 270 (referring to FIG. 10) into the resistance switching elements 272. The second etching process may be a dry etch that employs pure chemical etching process (e.g., plasma etching) or dry etching techniques that employs both physical and chemical etching techniques (e.g., RIE). Gases, such as $CH_3OH$, CO, $NH_3$ may be used during the second etching process. The top electrodes 282 may have a higher etch resistance to the second etching process than that of the resistance switching layer 270 (referring to FIG. 10), such that the top electrodes 282 may serve as a etch mask during the second etching process. In some embodiments, the bottom electrode layer 260 has a higher etch resistance to the second etching process than that of the resistance switching layer 270 (referring to FIG. 10), such that the bottom electrode layer 260 remain substantially intact after the second etching process. For example, the second bottom electrode layer 260 remains covering the second dielectric layer 240. In some embodiments, etch rate of the second etching process (e.g., RIE) is faster than the physical etching process (e.g., IBE), thereby achieving better throughput.

In some embodiments, the second etching process including chemical etching techniques (e.g., RIE) may damage or oxidize portions of sidewalls of the resistance switching elements 272, which in turn will result in some defects (also referred to as dead layers) at the sidewalls of the resistance switching elements 272.

In some embodiments, after the second etching process, a directional physical etching process may be performed to slightly etch sidewalls of the resistance switching elements 272. The directional physical etching process may include an IBE process. The IBE process may remove the dead layers (e.g., damaged portions and oxidized portions) of the sidewalls of resistance switching elements 272 caused during the chemical etching process or by exposing the sidewalls of resistance switching elements 272 to the atmosphere, thereby physically cleaning the sidewalls of the resistance switching elements 272, thereby obtaining the lower bit fail rate. The IBE process may use an etchant gas such as a CHF series (e.g., $CHF_2$, $CHF_3$, $CF_4$, $CH_xF_y$, or $CH_3OH$), Kr, Ne, Ar, O, N, the like, or a combination thereof. The IBE process may be performed in a chamber with a rotatable stage or substrate table with more than one axis of rotation. This rotation allows a more uniform etch profile and allows control of the angle of incidence of the ion beam. In some embodiments, the IBE process is performed within a range of about 0 degree to about 10 degrees for vertical etch.

In the present embodiments, a power of the IBE process performed to clean sidewalls of the resistance switching elements 272 may be lower than the IBE process performed to pattern the layers 150-170 in FIG. 3. For example, the power of the IBE process performed to clean sidewalls of the resistance switching elements 272 may be in a range from about 100V to about 600V. In some embodiments, the IBE process is performed such that the bottom electrode layer 260 may not be cut by the IBE process.

In some embodiments, since the dielectric layer 240 is not exposed to the IBE process, the thickness of the dielectric layer 240 is designed to be thinner than a thickness of the dielectric layer 130 is. For example, the thickness of the dielectric layer 240 is in a range from about 30 nanometers to about 50 nanometers, If the thickness of the dielectric layer 240 is less than 30 nanometers, the formation of the BEVA 250 may become difficult. If the thickness of the dielectric layer 240 is greater than 50 nanometers, due to the limited thickness of the ILD layer subsequently formed (e.g., the ILD layer 310 in FIG. 16), a portion of the ILD layer subsequently formed (e.g., the ILD layer 310 in FIG. 16) above the top electrode 282 may be too thin, which may result in difficulty in the formation of the top electrode via (e.g., the conductive feature 320 in FIG. 17). The BEVA 250 may have a height in a range from about 30 nanometers to about 50 nanometers according to the thickness of the dielectric layer 240. Therefore, a height of BEVA 140 greater than a height of the BEVA 250.

In some embodiments, a width of the resistance switching elements 272 may be greater than a width of the resistance switching elements 162. For example, the width of the resistance switching elements 272 may be in a range from about 75 nanometers to about 100 nanometers. If the width of the resistance switching elements 272 is less than about 75 nanometers, the resistance switching elements 272 may have a low stability for reflow application, and may not hold saved data for long term. If the width of the resistance switching elements 272 is greater than about 100 nanometers, it takes larger current to write/program the resistance switching elements 272, which in turn result in difficulty in programing operation.

Figure 12:
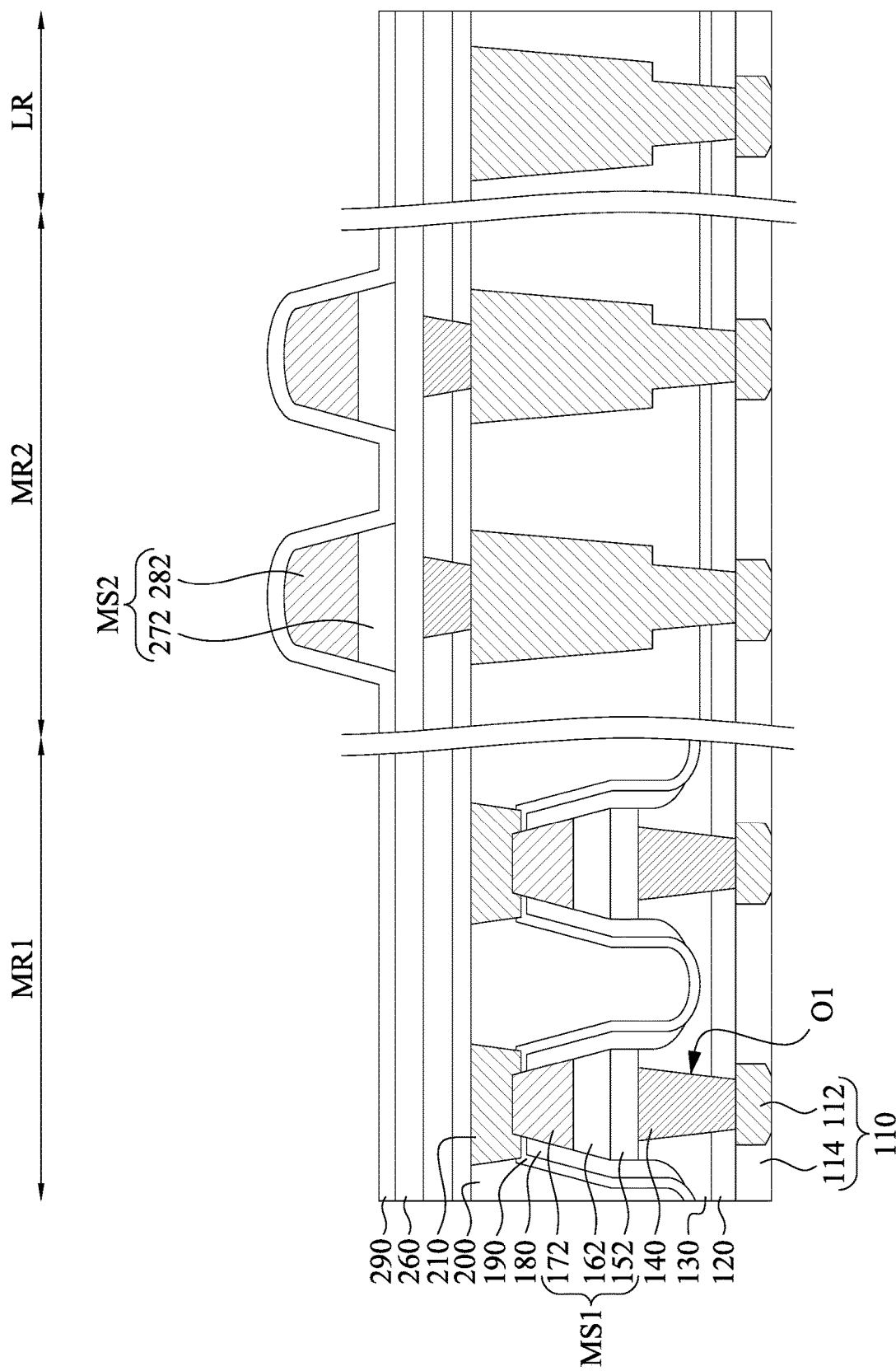

Reference is made to FIG. 12. A spacer layer 290 is deposited over the memory stacks MS2 and the bottom electrode layer 260. The spacer layer 290 in some embodiments may include SiN, but in other embodiments may include SiC, SiON, silicon oxycarbide (SiOC), the like, and/or combinations thereof. The spacer layer 290 may be formed using CVD, PVD, ALD, the like, and/or combinations thereof.

Figure 13:
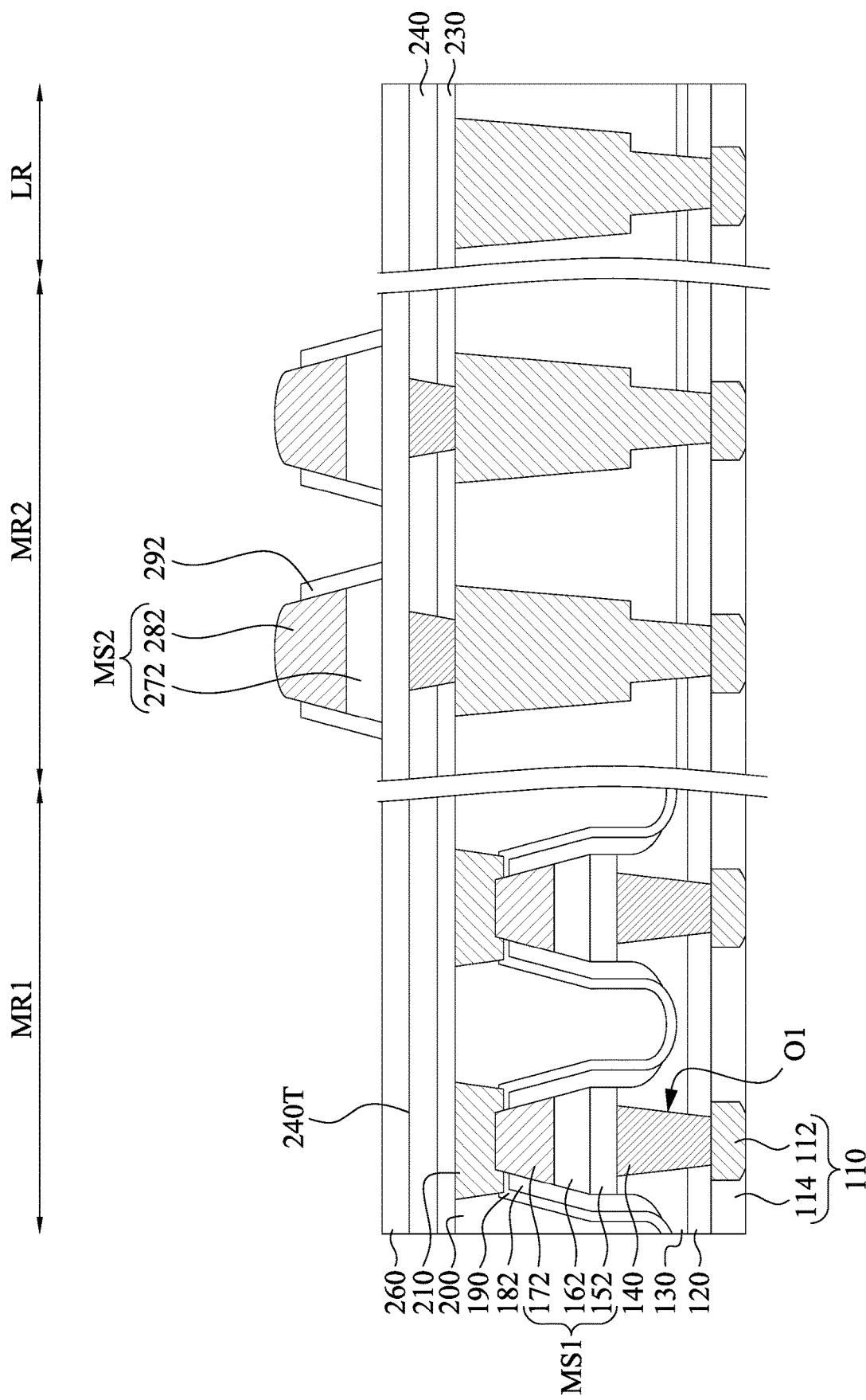

Reference is then made to FIG. 13. The spacer layer 290 (referring to FIG. 13) is patterned into spacers 292 by suitable etching process. The etching process may be anisotropic dry etching process, using gas etchants such as $CH_2F_2$, $CF_4$, $CH_xF_y$, $CHF_3$, $CH_4$, $N_2$, $O_2$, Ar, He, or the like. The etching process removes horizontal portions of the spacer layer 290 (referring to FIG. 12), and leaving vertical portions of the spacer layer 290 (referring to FIG. 12) on sidewalls of the memory stacks MS2. The remaining vertical portions of the spacer layer 290 (referring to FIG. 12) may be referred to as the spacer 292 hereinafter. In some embodiments, the spacers 292 respective encloses the resistance switching elements 272. The spacers 292 may include multiple layers in some embodiments. In some embodiments, the bottom electrode layer 260 may have a higher etch resistance to the etching process than that of the spacers 292, such that the etching process to the spacer layer 290 (referring to FIG. 13) may stop at the top surface of the bottom electrode layer 260. After the etching process, portions of the top electrodes 282 is exposed by the spacers 292.

Figure 14:
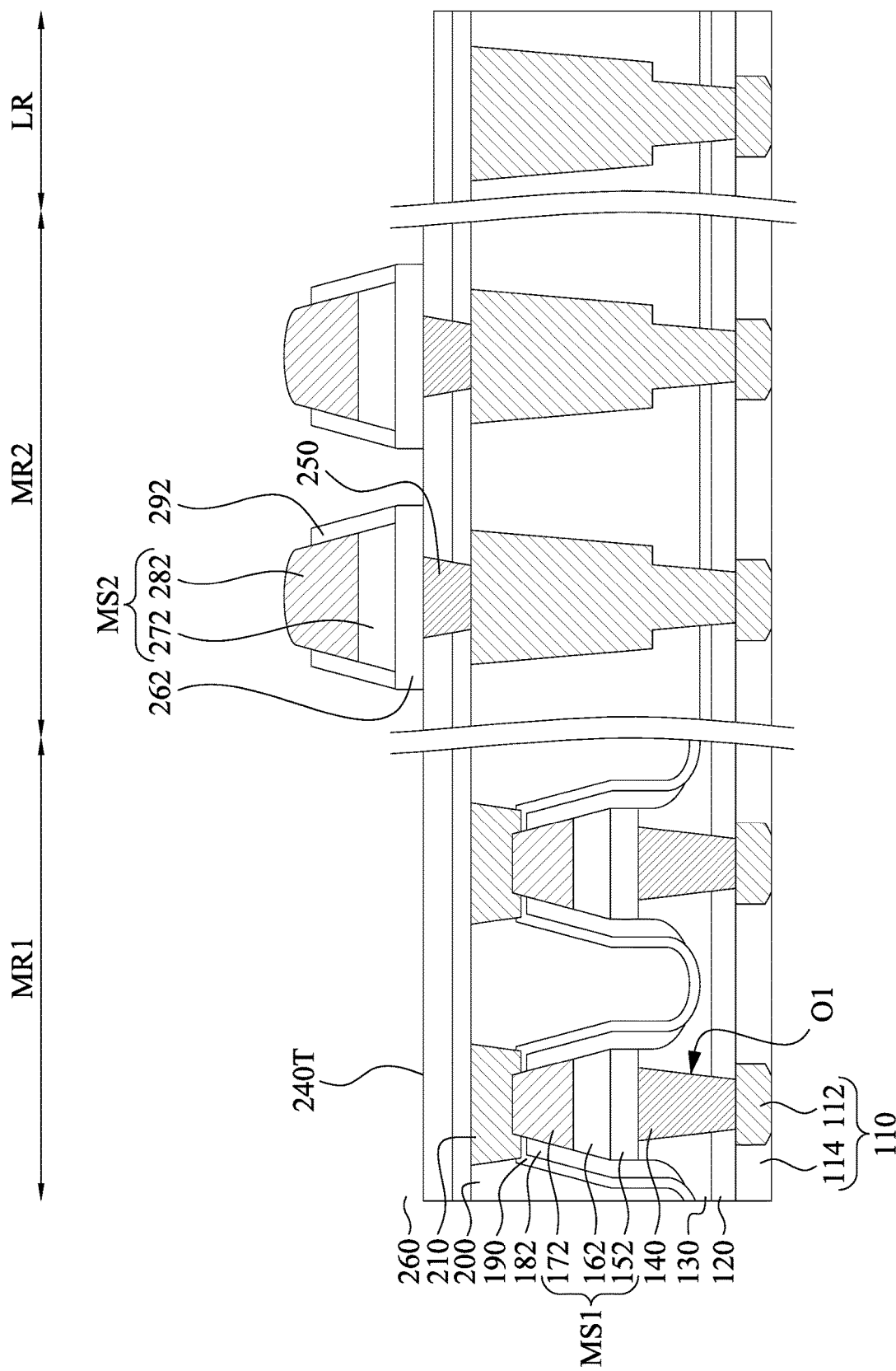

Reference is then made to FIG. 14. The bottom electrode layer 260 (referring to FIG. 13) is patterned into bottom electrodes 262 by suitable etching process. The bottom electrodes 262 are in contact with the BEVAs 250. The bottom electrode layer 260 (referring to FIG. 13) can be patterned using the spacers 292 as an etch mask, and hence the bottom electrode layer 260 (referring to FIG. 13) can be patterned in a self-aligned manner. In some embodiments, the patterning process may include one or more etching operations, such as dry etching, wet etching or a combination thereof. In some embodiments, the patterning process may include a dry etching using chlorine based, fluorine based, or oxygen containing gaseous etchant such as CO, $O_2$, $CO_2$, $CF_4$, $CH_2F_2$, $C_4F_8$, $NF_3$, $SF_6$, $Cl_2$, $BCl_3$ and/or other chemicals, as example. In some embodiments, the spacers 292 have etch resistance to the etching operation than that of the bottom electrodes 262, such that the resistance switching element 272 may be protected from being etched during the patterning the bottom electrode layer 260.

Figure 15:
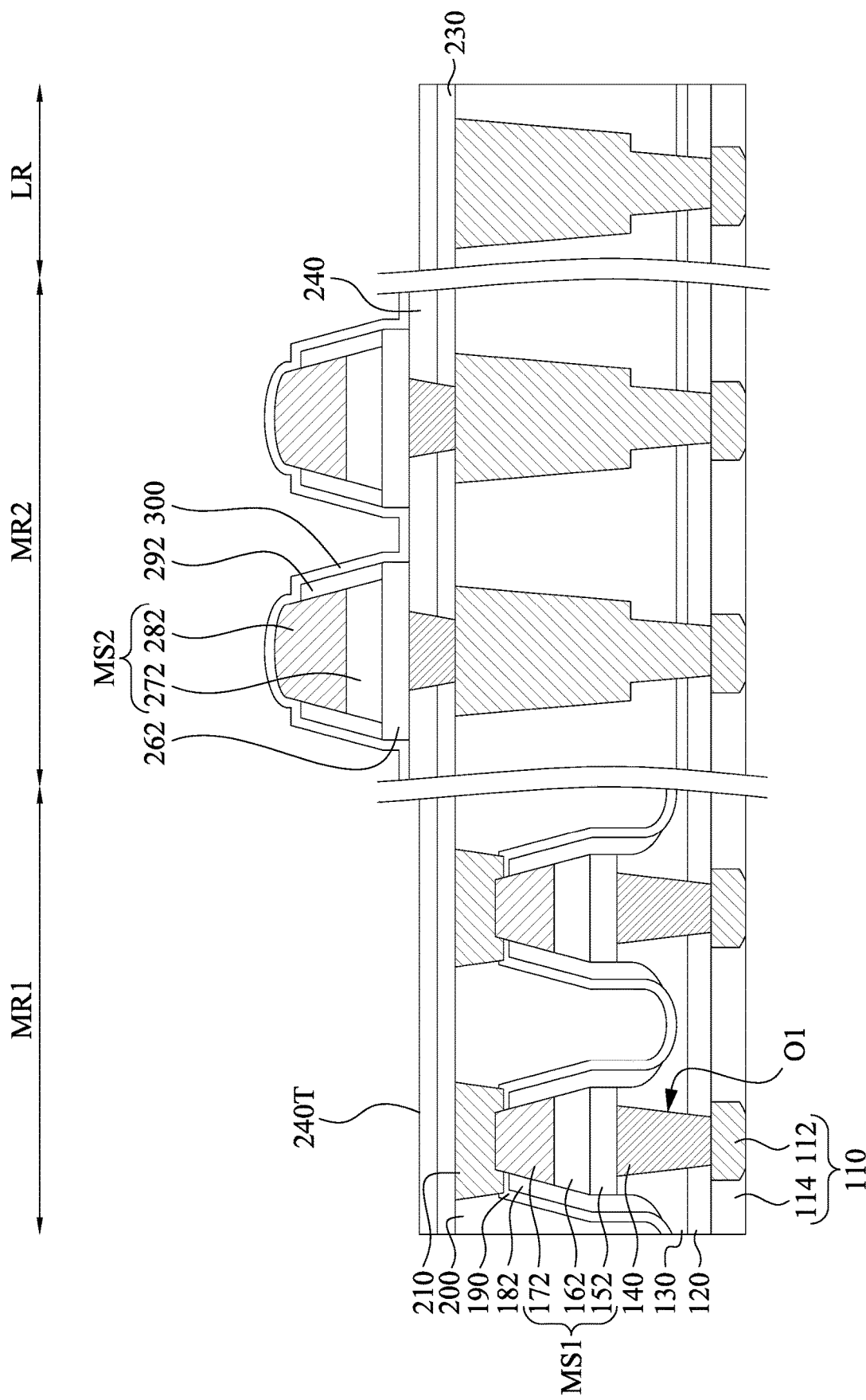

Reference is made to FIG. 15. A protective layer 300 is deposited over the spacers 292 and the dielectric layer 240. The protective layer 300 may be formed of dielectric material different from the etch stop layer 230 and the dielectric layer 240. In some embodiments, the protective layer 300 may be a metal-containing compound layer. For example, the protective layer 300 is made from $AlO_x$, AlN, $AlN_yO_x$, other suitable material, or the combination thereof. In some other embodiments, the protective layer 300 may be a metal oxide layer containing other metals. In some embodiments, the protective layer 300 can be a single layer or a multi-layered structure.

After the deposition of the protective layer 300, a portion of the protective layer 300 out of the memory region MR2 may be removed by suitable etching process. For example, an etch mask may be formed over the memory region MR2 and exposing the memory region MR1 and the logic region LR, and then the etching process is performed to remove the portion of the protective layer 300 in the memory region MR1 and the logic region LR through the etch mask. The etching process may use an etchant gas such as $Cl_2$, $BCl_3$, or a combination thereof. The etching process may further remove a portion of the dielectric layer 240 in the memory region MR1 and the logic region LR, thereby lowering a top surface 240T of the dielectric layer 240 in the memory region MR1 and the logic region LR. In some other embodiments, the etching process may remove a portion of the dielectric layer 240 out of the memory region MR2, such that a top surface of the etch stop layer 230 in the memory region MR1 and the logic region LR is exposed after the etching process.

Figure 16:
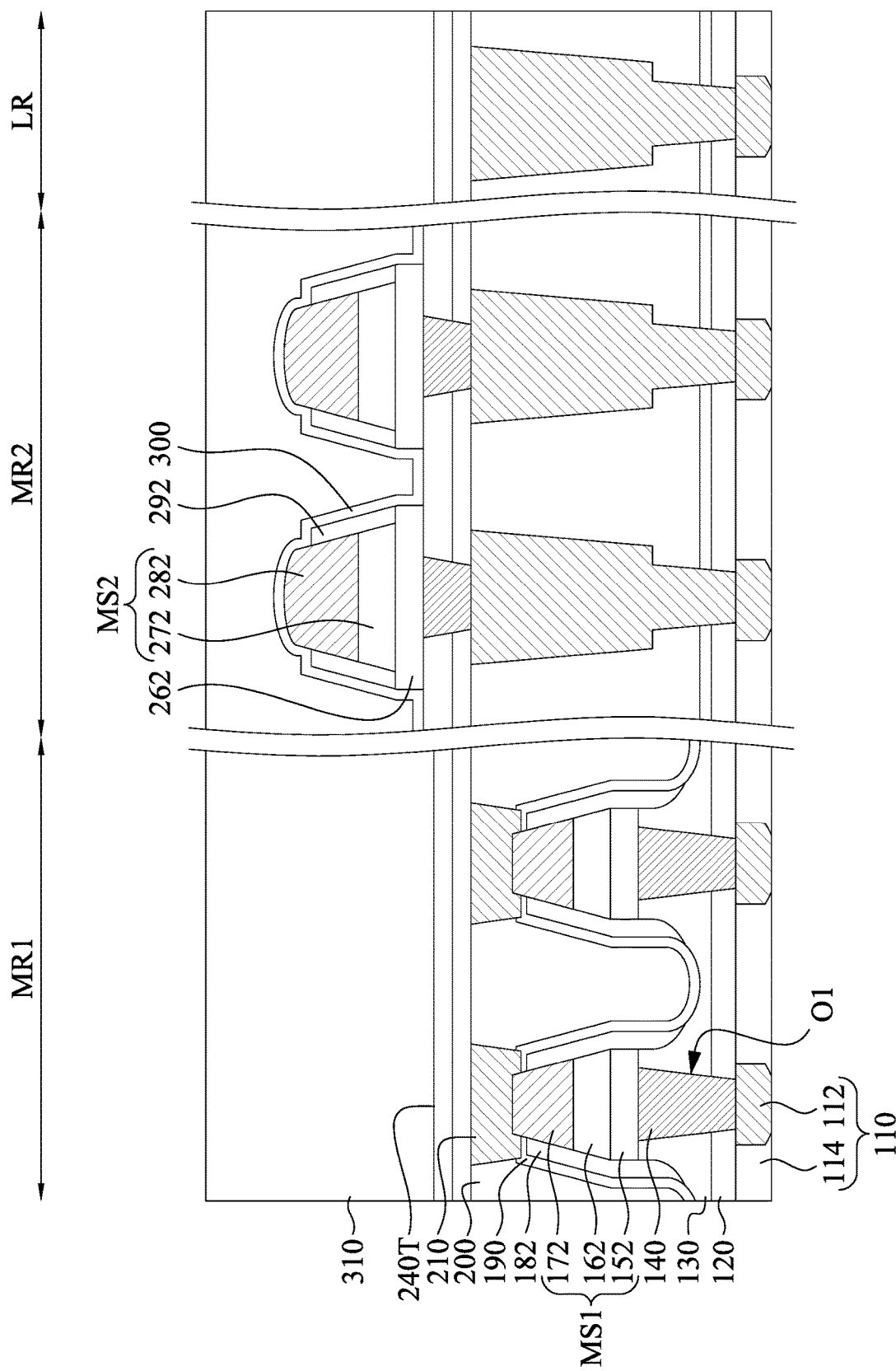

Reference is made to FIG. 16. An ILD layer 310 is formed over the substrate 110. In some embodiments, the ILD layer 310 may have the same material as the ILD layer 200. In some other embodiments, the ILD layer 310 may have a different material than the ILD layer 200. In some embodiments, the ILD layer 310 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. After the formation of the ILD layer 310, a planarization process may be performed to a top surface of the ILD layer 310, such that the top surface of the ILD layer 310 is planarized. The planarization process may include a CMP process.

Figure 17:
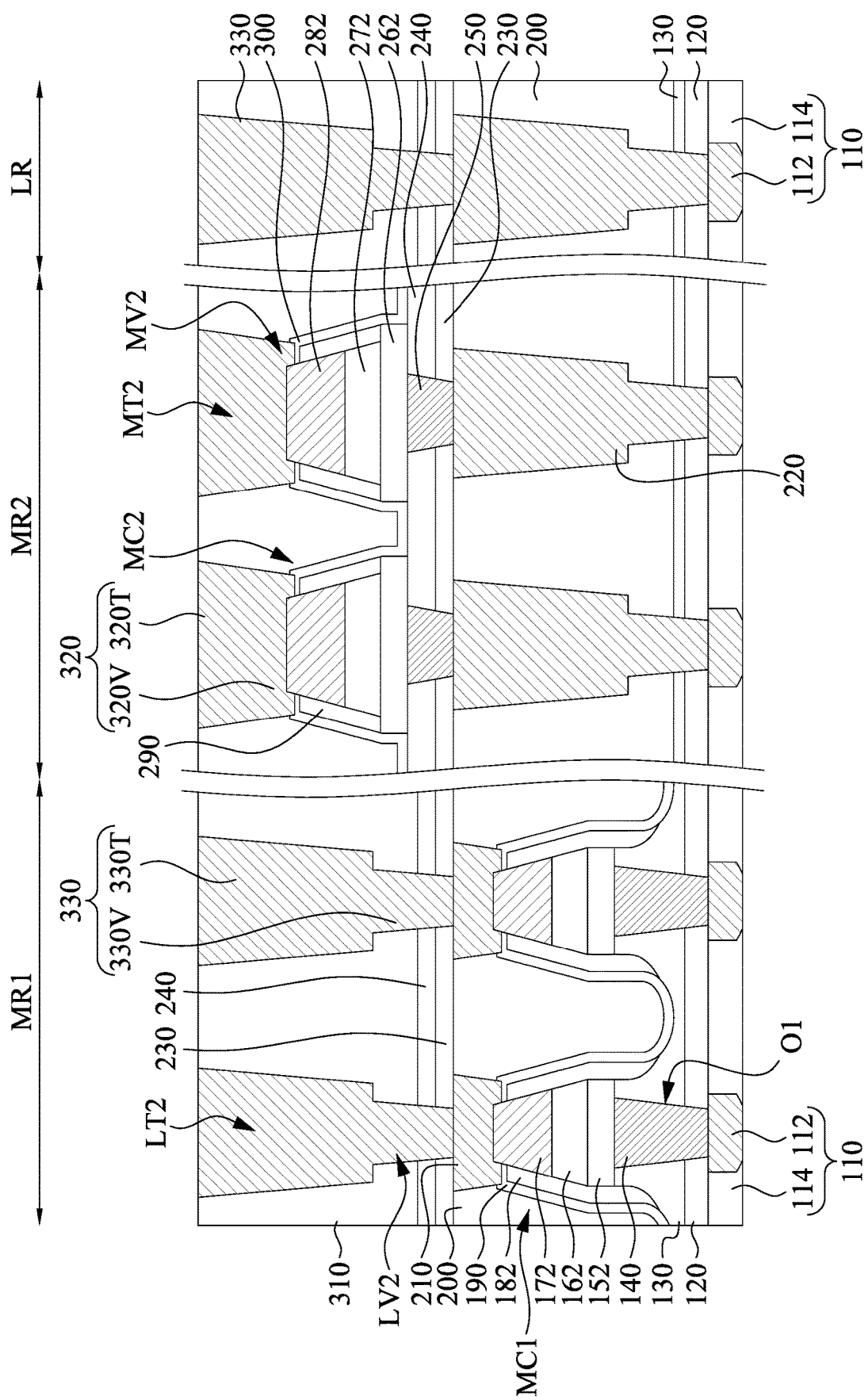

Reference is made to FIG. 17. A metallization pattern is then formed in the ILD layer 310. The metallization pattern may include conductive features 320 (e.g., top electrode via 320V and metal lines 320T) in the memory region MR2 and conductive features 330 (e.g., conductive via 330V and metal lines 330T) in the memory region MR1 and the logic region LR. In some embodiments, the conductive features 320 may be connected with the memory cells MC2, and some of the conductive features 330 may be connected with the memory cells MC1 through the conductive features 210.

Formation of the metallization pattern may include a via etching process, a trench etching process, a liner removal process, and a metal filling process. The via etching process may be performed to etch vias openings MV2 in the ILD layer 310 in the memory region MR2 and etch vias openings LV2 in the ILD layer 310 and dielectric layer 240 in the regions MR1 and LR. The trench etching process may be performed to etch trenches MT2 in the ILD layer 310 in the memory region MR2, etch trenches LT2 in the ILD layer 310 in the regions MR1 and LR, and deepen the vias openings MV2 and LV2 after the via etching process. The via etching process and the trench etching process may be suitable anisotropic etching processes. In some embodiments where the ILD layer 310 is silicon oxide, the etchant used in the via etching process and the trench etching process can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. The liner removal process may be performed to slope the sidewalls of the via openings MV2 and LV2 and remove a portion of the etch stop layer 230 exposed by the via opening LV2. The liner removal process may include one or more isotropic etching processes, such as dry etching processes using $CH_2F_2$ and Ar as etching gases.

In some embodiments, in the region MR2, the protective layer 300 may have a higher etch resistance to the via and trench etching processes than that of the ILD layer 310, such that the via and trench etching processes may stop at the protective layer 300. After the via and trench etching processes, a cleaning process may be performed to remove residue polymers. The cleaning process may use suitable wet liquid, such as acid liquid. The cleaning process may consume and remove a portion of the protective layer 300 exposed by the via openings MV2, thereby exposing the top electrodes 282. In some embodiments, the top electrodes 282 may have a higher resistance to the cleaning process than that of the protective layer 300, such that the cleaning process may stop at the top electrodes 282 and not damage the underlying layers.

In some embodiments, in the regions MR1 and LR, the etch stop layer 230 may have a higher etch resistance to the via and trench etching processes than that of the ILD layer 310 and the dielectric layer 240, such that the via and trench etching processes may stop at the etch stop layer 230. The liner removal process may remove a portion of the etch stop layer 230 exposed by the via opening LV2 and expose the underlying conductive features 210. In some embodiments, the conductive features 210 may have a higher etch resistance to the liner removal process than that of the etch stop layer 230, such that the liner removal process may stop at the conductive features 210 and not damage the underlying layers.

The metal filling process is performed to fill one or more metals (e.g., copper) in the via openings MV2 and LV2 and the trenches MT2 and LT2 to form the metallization pattern. After the openings and trenches are filled with metals, a planarization is performed to remove an excess portion of the metals outside the openings, and therefore forming the top electrode via 320V, metal lines 320T, conductive via 330V, and metal lines 330T.

Through the configuration, plural memory cells MC2 are formed. In some embodiments, each of the memory cells MC2 includes a resistance switching element 272, a top electrode 282 over the resistance switching element 272, and a bottom electrode 262 under the resistance switching element 272, a BEVA 250 under the bottom electrode 262, and a conductive feature 320 over the top electrode 282. Through the configuration, the memory cells MC2 have a large resistance switching elements 272 (e.g., larger than the resistance switching elements 162 of the memory cells MC1), such that the memory cells MC2 has a high thermal stability for reflow application, thereby having the capability to hold saved data for long term even if the power is turned off, which in turn allows the memory cells MC2 behave as a non-volatile memory, such as flash-like.

In some embodiments, the BEVAs 250 are surrounded the etch stop layer 230 and the dielectric layer 240. In some embodiments, the etch stop layer 230 and the dielectric layer 240 extend across the logic region LC and the memory regions MR1 and MR2. In some embodiments, the protective layer 300 surround the memory cell MR2 in the memory region MR2 and terminates prior to reach the logic region LR and the memory region MR1.

Through the process, the RAM-like memory cells MC1 and the flash-like memory cells MC2 may be formed on a single chip. That is to say, a single chip has a memory region MR1 and a memory region MR2, the memory region MR1 accommodates the RAM-like memory cells MC1, and the memory region MR1 accommodates flash-like memory cells MC2. In some embodiments, the memory region MR1 may surround the memory region MR2. For example, the memory region MR1 may have a ring-shape as view from top, and the memory region MR2 is surrounded by the ring-shaped memory region MR1. In some embodiments, the memory region MR2 may surround the memory region MR1. For example, the memory region MR2 may have a ring-shape as view from top, and the memory region MR1 is surrounded by the ring-shaped memory region MR2.

In some embodiments of the present disclosure, a distance between the memory cell MC1 and the substrate 110 is different from a distance between the memory cell MC2 and the substrate 110. For example, the memory cell MC2 is at a higher position than the memory cell MC1 is in the present embodiments. In some other embodiments, the memory cell MC1 is at a higher position than the memory cell MC2 is. In some embodiments of the present disclosure, the memory cell MC2 is misaligned with the memory cell MC1. For example, the resistance switching element 162 is misaligned with the resistance switching element 272. In some other embodiments, the memory cell MC2 may be vertically aligned with the memory cell MC1.

Figure 18:
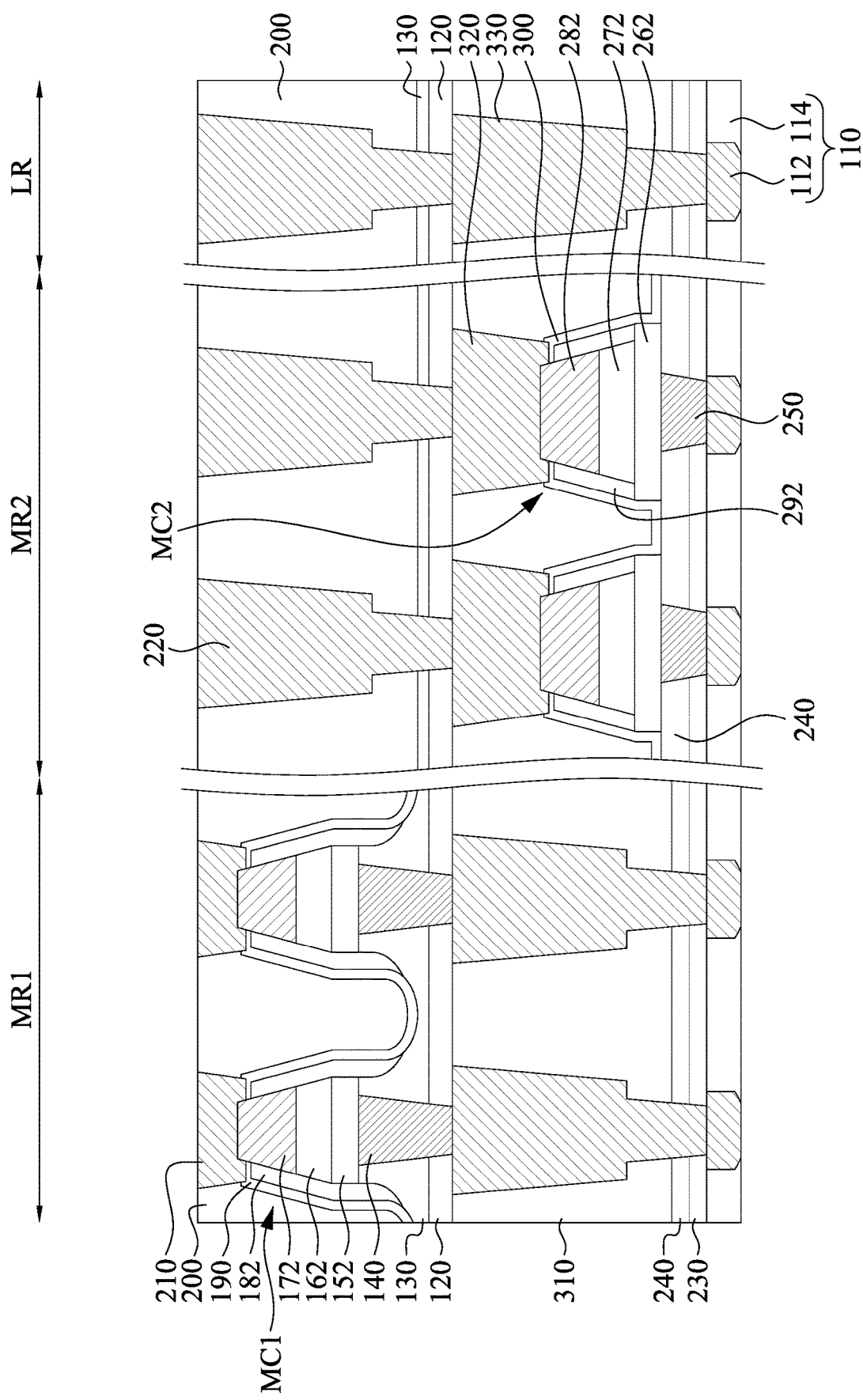
FIG. 18 is a cross-sectional view of the semiconductor device according to various embodiments of the present disclosure.

FIG. 18 is a cross-sectional view of the semiconductor device according to various embodiments of the present disclosure. The present embodiments are similar to those shown in the embodiments of FIGS. 1-17, except that the memory cell MC1 is at a higher position than the memory cell MC2 is. To be specific, the step of forming the memory cell MC2 as shown in FIGS. 8-17 may be performed prior to the formation of the memory cell MC1 as shown in FIGS. 1-7. For example, after the formation of the memory cells MC2, the interlayer dielectric layer 310, and the conductive features 320 and 330, the etch stop layer 120, the dielectric layer 130, the BEVAs 140, and the layers 150-170 (referring to FIG. 3) are formed thereon, and the layers 150-170 are patterned by the IBE process, thereby forming the memory cells MC1. Subsequently, the interlayer dielectric layer 200 is formed over the interlayer dielectric layer 310 and surrounding the memory cells MC1, and the conductive features 210 and 220 are formed in the interlayer dielectric layer 310. In some embodiments, the conductive features 210 may be connected with the memory cells MC1, and some of the conductive features 220 may be connected with the memory cells MC2 through the conductive features 320.

Through the configuration, the RAM-like memory cells MC1 and the flash-like memory cells MC2 may be formed on a single chip, and the memory cell MC2 is misaligned with the memory cell MC1. In some other embodiments, the memory cell MC2 may be vertically aligned with the memory cell MC1. Other details of the present embodiments are similar to those aforementioned, and therefore not repeated herein.

Figure 19:
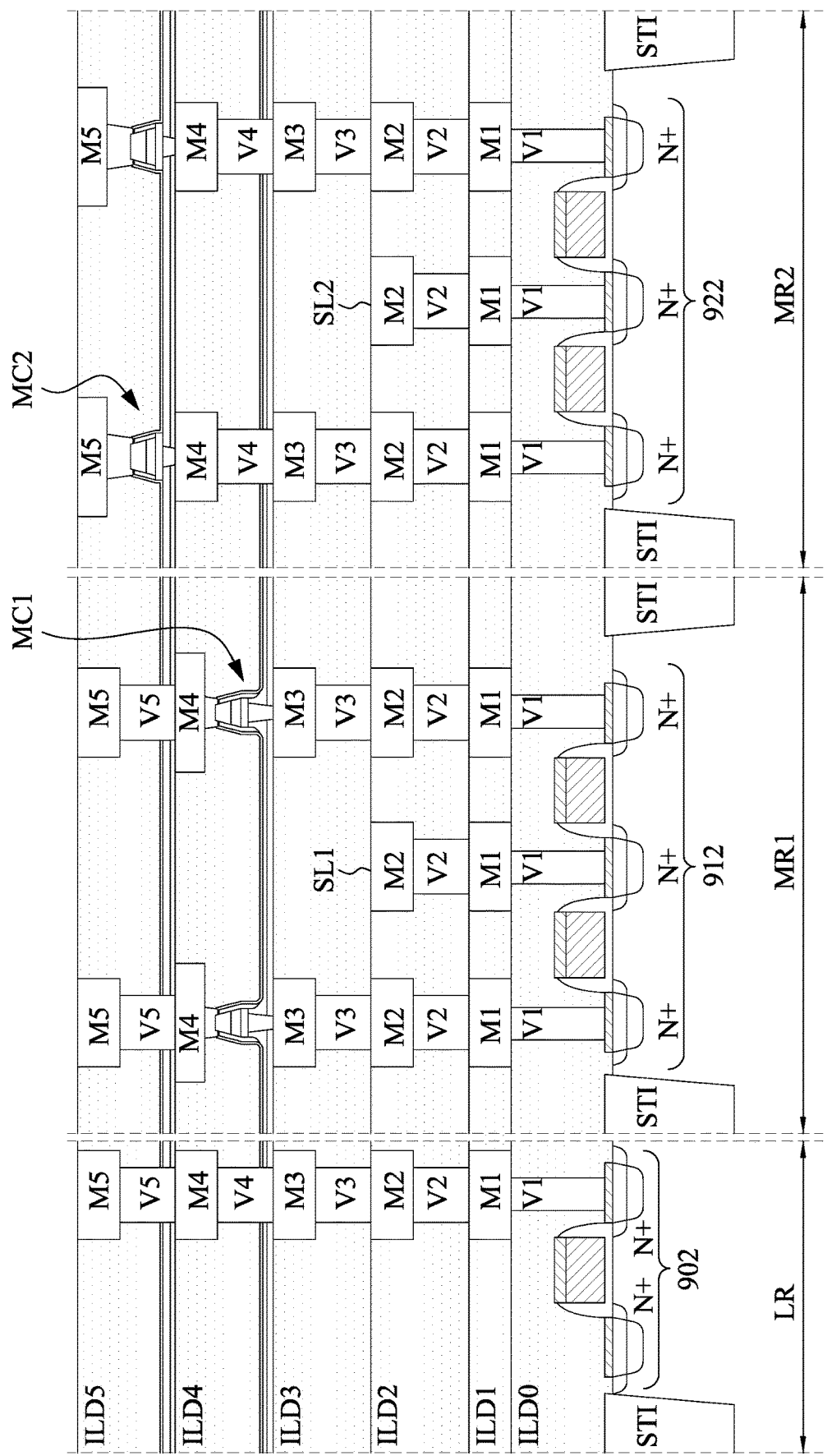
FIG. 19 illustrates an integrated circuit including MRAM devices and logic devices.

FIG. 19 illustrates an integrated circuit including memory cells and logic devices. The integrated circuit includes a logic region LR and memory regions MR1 and MR2. Logic region LR may include circuitry, such as the exemplary transistor 902, for processing information received from memory cells MC1 and MC2 in the memory regions MR1 and MR2 and for controlling reading and writing functions of memory cells MC1 and MC2. In some embodiments, each of the memory cells MC1 and MC2 includes an resistance switching element 162/272, a top electrode 172/282 over the resistance switching element 162/272, and a bottom electrode 152/262 under the resistance switching element 162/272, a BEVA 140/250 under the bottom electrode 162/272, and a conductive feature 210/320 over the top electrode 172/282. The memory cells MC1 and MC2 may have different widths and different heights.

As depicted, the integrated circuit is fabricated using five metallization layers, labeled as M1 through M5, with five layers of metallization vias or interconnects, labeled as V1 through V5. Other embodiments may contain more or fewer metallization layers and a corresponding more or fewer number of vias. Logic region LR includes a full metallization stack, including a portion of each of metallization layers M1-M5 connected by interconnects V2-V5, with V1 connecting the stack to a source/drain contact of logic transistor 902. The memory region MR1 includes a full metallization stack connecting memory cells MC1 to transistors 912 in the memory region MR1, and a partial metallization stack connecting a source line SL1 to transistors 912 in the memory region MR1. Memory cells MC1 are depicted as being fabricated in between the top of the M3 layer and the bottom the M4 layer. The memory region MR2 includes a full metallization stack connecting memory cells MC2 to transistors 922 in the memory region 920, and a partial metallization stack connecting a source line SL2 to transistors 922 in the memory region MR2. Memory cells MC2 are depicted as being fabricated in between the top of the M4 layer and the bottom the M5 layer. Six ILD layers, identified as ILD0 through ILD5 are depicted in FIG. 19 as spanning the logic region LR and the memory regions MR1 and MR2. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the memory cells having smaller resistance switching elements and the memory cells having larger resistance switching elements are formed on one single chip, such that the single chip has a region for applicable for quick reading/programming operations, and another region for holding saved data for long term. Another advantage is that a dielectric layer underlying the memory cells having smaller resistance switching elements has a large thickness, for example, greater than a thickness of another dielectric layer underlying the memory cells having larger resistance switching element), such that the dielectric layer underlying the memory cells having smaller resistance switching elements may be recessed by a physical etching process, thereby reducing the redeposited films on sidewalls of the smaller resistance switching elements.

In some embodiments, a method for fabricating the semiconductor device is provided. The method includes depositing a first dielectric layer; forming a first memory cell over the first dielectric layer; depositing a second dielectric layer over the first memory cell; and forming a second memory cell over the second dielectric layer. Forming the first memory cell includes depositing a first resistance switching layer over the first dielectric layer and performing a first physical etching process to pattern the first resistance switching layer into a first resistance switching element. Forming the second memory cell includes depositing a second resistance switching layer over the second dielectric layer and performing a chemical etching process to pattern the second resistance switching layer into a second resistance switching element.

In some embodiments, a method for fabricating the semiconductor device is provided. The method includes depositing a first bottom electrode layer over a substrate; depositing a first resistance switching layer over the first bottom electrode layer; patterning the first resistance switching layer into a first resistance switching element over the first bottom electrode layer; forming a spacer around the first resistance switching element; patterning the first bottom electrode layer into a first bottom electrode below the first resistance switching element and the spacer; forming an interlayer dielectric layer surrounding the first resistance switching element and the spacer; depositing a second bottom electrode layer over the interlayer dielectric layer; depositing a second resistance switching layer over the second bottom electrode layer; and patterning the second resistance switching layer and the second bottom electrode layer respectively into a second resistance switching element and a second bottom electrode by a physical etching process.

In some embodiments, a semiconductor device includes a substrate, a first memory cell and a second memory cell over the substrate. The first memory cell includes a first bottom electrode, a first resistance switching element over the first bottom electrode, and a first top electrode over the first resistance switching element. The second memory cell includes a second bottom electrode, a second resistance switching element over the second bottom electrode, and a second top electrode over the second resistance switching element. The second resistance switching element is larger than the first resistance switching element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   depositing a first dielectric layer;
   forming a first bottom electrode via in the first dielectric layer;
   forming a first memory cell over the first bottom electrode via, wherein forming the first memory cell comprises:
   depositing a first resistance switching layer over the first dielectric layer; and
   performing a first physical etching process to pattern the first resistance switching layer into a first resistance switching element, wherein the first dielectric layer has a first thickness prior to performing the first physical etching process, and a portion of the first dielectric layer is recessed to have a second thickness less than the first thickness of the first dielectric layer after performing the first physical etching process;
   depositing a second dielectric layer over the first memory cell, wherein the second dielectric layer has a thickness less than the first thickness of the first dielectric layer and greater than the second thickness of the recessed portion of the first dielectric layer;
   forming a second bottom electrode via in the second dielectric layer; and
   forming a second memory cell over the second bottom electrode via, wherein forming the second memory cell comprises:
   depositing a second resistance switching layer over the second dielectric layer; and
   performing a chemical etching process to pattern the second resistance switching layer into a second resistance switching element.

2. The method of claim 1, wherein the first physical etching process and the chemical etching process are performed such that the second resistance switching element is larger than the first resistance switching element.

3. The method of claim 1, wherein forming the second memory cell over the second dielectric layer is performed such that the second dielectric layer has a portion remaining directly over the first memory cell.

4. The method of claim 1, wherein forming the first memory cell further comprises:
   depositing a first bottom electrode layer over the first dielectric layer prior to depositing the first resistance switching layer, wherein the first physical etching process is performed such that the first bottom electrode layer is patterned into a first bottom electrode below the first resistance switching element.

5. The method of claim 1, wherein forming the first memory cell further comprises:
   depositing a first top electrode layer over the first resistance switching layer, wherein the first physical etching process is performed such that the first top electrode layer is patterned into a first top electrode over the first resistance switching element.

6. The method of claim 1, wherein the first physical etching process is performed such that a recess is formed in the first dielectric layer.

7. The method of claim 1, wherein forming the second memory cell further comprises:
   performing a second physical etching process to clean a sidewall of the second resistance switching element after the chemical etching process, wherein a power of the second physical etching process is less than a power of the first physical etching process.

8. The method of claim 1, wherein forming the second memory cell further comprises:
   depositing a second bottom electrode layer over the second dielectric layer prior to depositing the second resistance switching layer, wherein the chemical etching process is performed such that the second bottom electrode layer remains covering the second dielectric layer; and
   patterning the second bottom electrode layer into a second bottom electrode below the second resistance switching element after the chemical etching process.

9. The method of claim 8, wherein the second bottom electrode layer has a higher etch resistance to the chemical etching process than that of the second resistance switching layer.

10. The method of claim 1, wherein forming the second memory cell further comprises:

depositing a second top electrode layer over the second resistance switching layer; and patterning the second top electrode layer into a second top electrode over the second resistance switching layer prior to the chemical etching process.

11. The method of claim 10, wherein the second top electrode has a higher etch resistance to the chemical etching process than that of the second resistance switching layer.

12. The method of claim 1, wherein a height of the second bottom electrode via in the second dielectric layer is less than a height of the first bottom electrode via in the first dielectric layer.

13. A method for fabricating a semiconductor device, comprising:

depositing a first bottom electrode layer over a substrate;

depositing a first resistance switching layer over the first bottom electrode layer;

patterning the first resistance switching layer into a first resistance switching element over the first bottom electrode layer;

forming a spacer around the first resistance switching element;

patterning the first bottom electrode layer into a first bottom electrode below the first resistance switching element and the spacer;

forming a first interlayer dielectric layer surrounding the first resistance switching element and the spacer;

forming a first conductive feature in the first interlayer dielectric layer and over the first resistance switching element;

depositing a second bottom electrode layer over the first interlayer dielectric layer;

depositing a second resistance switching layer over the second bottom electrode layer;

patterning the second resistance switching layer and the second bottom electrode layer respectively into a second resistance switching element and a second bottom electrode by a physical etching process;

depositing a second interlayer dielectric layer surrounding the second resistance switching element; and forming a second conductive feature in the second interlayer dielectric layer and over the second resistance switching element and a third conductive feature in the second interlayer dielectric layer and over the first conductive feature, wherein the third conductive feature comprises a metal via over the first conductive feature and a metal line over the metal via, and a bottom surface of the metal line is lower than a bottom surface of the second resistance switching element.

14. The method of claim 13, wherein patterning the second resistance switching layer and the second bottom electrode layer is performed such that a sidewall of the second resistance switching element is aligned with a sidewall of the second bottom electrode.

15. The method of claim 13, wherein patterning the first resistance switching layer and patterning the second resistance switching layer and the second bottom electrode layer are performed such that the first resistance switching element is larger than the second resistance switching element.

16. The method of claim 13, wherein patterning the first resistance switching layer and patterning the second resistance switching layer and the second bottom electrode layer are performed such that first resistance switching element is misaligned with the second resistance switching element.

17. The method of claim 13, further comprising:

cleaning a sidewall of the first resistance switching element by a directional etching process after patterning the first resistance switching layer.

18. The method of claim 13, further comprising:

performing an ion beam etching process to clean a sidewall of the first resistance switching element prior to forming the spacer and prior to patterning the first bottom electrode layer into the first bottom electrode.

19. A method for fabricating a semiconductor device, comprising:

forming an interconnect layer over a semiconductor device, wherein the interconnect layer comprises a first conductive feature and a second conductive feature;

depositing a first dielectric layer over the interconnect layer;

forming a first bottom electrode via in the first dielectric layer and over the first conductive feature;

forming a first memory cell over the first bottom electrode via, wherein the first memory cell comprises a first resistance switching layer;

depositing an interlayer dielectric layer surrounding the first memory cell;

forming a third conductive feature in the interlayer dielectric layer and over the first memory cell and a fourth conductive feature in the interlayer dielectric layer and over the second conductive feature, wherein the fourth conductive feature comprises a metal via over the second conductive feature and a metal line over the metal via, and a bottom surface of the metal line is lower than a bottom surface of the first resistance switching layer;

depositing a second dielectric layer over the first memory cell;

forming a second bottom electrode via in the second dielectric layer and over a top surface of the metal line of the fourth conductive feature; and forming a second memory cell over the second bottom electrode via, wherein the second memory cell comprises a second resistance switching layer, and a width of the second resistance switching layer is greater than a width of the first resistance switching layer.

20. The method of claim 19, wherein a height of the second bottom electrode via is less than a height of the first bottom electrode via.

* * * * *